United States Patent
Do et al.

(10) Patent No.: US 8,629,567 B2
(45) Date of Patent: Jan. 14, 2014

(54) INTEGRATED CIRCUIT PACKAGING SYSTEM WITH CONTACTS AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 87 days.

(21) Appl. No.: 13/326,728

(22) Filed: Dec. 15, 2011

(65) Prior Publication Data

US 2013/0154118 A1 Jun. 20, 2013

(51) Int. Cl.
*H01L 23/48* (2006.01)
*H01L 23/52* (2006.01)
*H01L 29/40* (2006.01)

(52) U.S. Cl.
USPC ........... 257/787; 257/678; 257/758; 257/788; 257/E21.007; 257/E21.17; 257/E21.134; 257/E21.219; 257/E21.237; 257/E21.329; 257/E21.499; 257/E21.502; 257/E21.503; 257/E21.509; 257/E21.511

(58) Field of Classification Search
USPC ......... 257/787, 678, 499, 788, 622, 659, 713, 257/728, 758, 759, 784, E21.006, E21.007, 257/E21.17, E21.26, E21.134, E21.219, 257/E21.237, E21.329, E21.499, E21.502, 257/E21.503, E21.509, E21.511
See application file for complete search history.

(56) References Cited

U.S. PATENT DOCUMENTS

| | | |
|---|---|---|
| 4,714,952 A | 12/1987 | Takekawa et al. |
| 5,707,881 A | 1/1998 | Lum |
| 5,898,217 A | 4/1999 | Johnston |
| 6,184,574 B1 | 2/2001 | Bissey |
| 6,194,291 B1 | 2/2001 | DiStefano et al. |
| 6,238,952 B1 | 5/2001 | Lin |
| 6,335,565 B1 | 1/2002 | Miyamoto et al. |
| 6,492,719 B2 | 12/2002 | Miyamoto et al. |
| 6,562,660 B1 | 5/2003 | Sakamoto et al. |
| 6,731,013 B2 | 5/2004 | Juso et al. |
| 6,734,550 B2 | 5/2004 | Martin et al. |
| 6,889,429 B2 | 5/2005 | Celaya et al. |
| 6,970,005 B2 | 11/2005 | Rincon et al. |
| 7,049,177 B1 | 5/2006 | Fan et al. |
| 7,060,535 B1 | 6/2006 | Sirinorakul et al. |
| 7,199,453 B2 | 4/2007 | Lai et al. |
| 7,291,908 B2 | 11/2007 | Pan et al. |
| 7,405,106 B2 | 7/2008 | Maloney et al. |
| 7,548,430 B1 | 6/2009 | Huemoeller et al. |
| 7,554,179 B2 * | 6/2009 | Shim et al. ............ 257/675 |
| 7,618,846 B1 | 11/2009 | Pagaila et al. |
| 7,622,801 B2 | 11/2009 | Kurita |
| 7,777,351 B1 | 8/2010 | Berry et al. |
| 7,786,557 B2 | 8/2010 | Hsieh et al. |

(Continued)

OTHER PUBLICATIONS

U.S. Appl. No. 13/102,052, filed May 5, 2011, Do et al.

(Continued)

*Primary Examiner* — David Nhu
(74) *Attorney, Agent, or Firm* — Ishimaru & Associates LLP

(57) ABSTRACT

A method of manufacture of an integrated circuit packaging system includes: forming an isolated contact having a contact protrusion; forming a die paddle, adjacent to the isolated contact, having a die paddle contour; depositing a contact pad on the contact protrusion; coupling an integrated circuit die to the contact protrusion; molding an encapsulation on the integrated circuit die; and depositing an organic filler on and between the isolated contact and the die paddle, the contact protrusion extended past the organic filler.

10 Claims, 7 Drawing Sheets

(56) References Cited

U.S. PATENT DOCUMENTS

| | | |
|---|---|---|
| 7,791,203 B2 | 9/2010 | Boon et al. |
| 7,923,304 B2 | 4/2011 | Choi et al. |
| 7,928,552 B1 | 4/2011 | Cho et al. |
| 7,936,048 B2 | 5/2011 | Otremba |
| 7,986,048 B2 | 7/2011 | Park et al. |
| 7,989,270 B2 | 8/2011 | Huang et al. |
| 8,053,275 B2 | 11/2011 | Hasegawa |
| 8,097,490 B1 | 1/2012 | Pagaila et al. |
| 8,133,762 B2 | 3/2012 | Pagaila et al. |
| 8,174,109 B2 | 5/2012 | Uchiyama |
| 8,178,976 B2 | 5/2012 | Dunne et al. |
| 8,193,037 B1 | 6/2012 | Bathan et al. |
| 8,258,008 B2 | 9/2012 | Lee et al. |
| 8,283,205 B2 | 10/2012 | Pagaila et al. |
| 8,372,689 B2 | 2/2013 | Lee et al. |
| 2001/0005601 A1 | 6/2001 | Shin et al. |
| 2002/0030972 A1 | 3/2002 | Ali et al. |
| 2002/0084522 A1 | 7/2002 | Yoshizawa et al. |
| 2002/0117743 A1 | 8/2002 | Nakatani et al. |
| 2002/0134582 A1 | 9/2002 | Celaya et al. |
| 2003/0006055 A1 | 1/2003 | Chien-Hung et al. |
| 2003/0203540 A1 | 10/2003 | Hur |
| 2004/0063246 A1 | 4/2004 | Karnezos |
| 2004/0262724 A1 | 12/2004 | Hsu |
| 2005/0146018 A1 | 7/2005 | Jang et al. |
| 2005/0156291 A1 | 7/2005 | Shiu et al. |
| 2005/0161251 A1 | 7/2005 | Mori et al. |
| 2005/0248041 A1 | 11/2005 | Kuah et al. |
| 2005/0258529 A1 | 11/2005 | Green et al. |
| 2005/0263320 A1 | 12/2005 | Igarashi et al. |
| 2006/0033516 A1 | 2/2006 | Rincon et al. |
| 2006/0060960 A1 | 3/2006 | Cho et al. |
| 2006/0118941 A1 | 6/2006 | Lai et al. |
| 2006/0125080 A1 | 6/2006 | Hsu |
| 2007/0018292 A1 | 1/2007 | Sutardja |
| 2007/0132089 A1 | 6/2007 | Jiang et al. |
| 2007/0145548 A1 | 6/2007 | Park et al. |
| 2007/0170559 A1 | 7/2007 | Camacho et al. |
| 2007/0181989 A1 | 8/2007 | Corisis et al. |
| 2007/0219033 A1 | 9/2007 | Otremba |
| 2008/0006942 A1 | 1/2008 | Park et al. |
| 2008/0036050 A1 | 2/2008 | Lin et al. |
| 2008/0182398 A1 | 7/2008 | Carpenter et al. |
| 2009/0014859 A1 | 1/2009 | Jeung et al. |
| 2009/0039523 A1 | 2/2009 | Jiang et al. |
| 2009/0152740 A1 | 6/2009 | Park et al. |
| 2009/0184412 A1 | 7/2009 | Yasunaga |
| 2009/0236752 A1 | 9/2009 | Lee et al. |
| 2010/0001384 A1 | 1/2010 | Bathan et al. |
| 2010/0032821 A1 | 2/2010 | Pagaila et al. |
| 2010/0044850 A1 | 2/2010 | Lin et al. |
| 2010/0072570 A1 | 3/2010 | Pagaila et al. |
| 2010/0181658 A1 | 7/2010 | Yamashita |
| 2010/0216281 A1 | 8/2010 | Pagaila et al. |
| 2010/0244208 A1 | 9/2010 | Pagaila et al. |
| 2010/0244219 A1 | 9/2010 | Pagaila et al. |
| 2011/0062598 A1 | 3/2011 | Lam |
| 2011/0068478 A1 | 3/2011 | Pagaila et al. |
| 2011/0147901 A1 | 6/2011 | Huang et al. |
| 2011/0244636 A1 | 10/2011 | Kondo |
| 2011/0254172 A1 | 10/2011 | Park et al. |
| 2012/0061822 A1 | 3/2012 | Pagaila |
| 2012/0119360 A1 | 5/2012 | Kim et al. |
| 2012/0146235 A1 | 6/2012 | Choi et al. |
| 2012/0168963 A1 | 7/2012 | Huang et al. |
| 2012/0181689 A1 | 7/2012 | Do et al. |
| 2012/0199972 A1 | 8/2012 | Pagaila et al. |
| 2012/0200303 A1 | 8/2012 | Guo et al. |
| 2012/0273931 A1 | 11/2012 | Yang et al. |
| 2012/0273947 A1 | 11/2012 | Mo |
| 2012/0319286 A1 | 12/2012 | Yang et al. |
| 2012/0319295 A1 | 12/2012 | Chi et al. |
| 2012/0326325 A1 | 12/2012 | Choi et al. |
| 2013/0049218 A1 | 2/2013 | Gong et al. |
| 2013/0052777 A1 | 2/2013 | Xu et al. |
| 2013/0062761 A1 | 3/2013 | Lin et al. |
| 2013/0075899 A1 | 3/2013 | Huang et al. |
| 2013/0075902 A1 | 3/2013 | Chow et al. |
| 2013/0078915 A1 | 3/2013 | Zhao et al. |
| 2013/0154072 A1 | 6/2013 | Do et al. |
| 2013/0154080 A1 | 6/2013 | Do et al. |

OTHER PUBLICATIONS

U.S. Appl. No. 13/102,041, filed May 5, 2011, Do et al.

\* cited by examiner

INTEGRATED CIRCUIT PACKAGING SYSTEM WITH CONTACTS AND METHOD OF MANUFACTURE THEREOF

CROSS-REFERENCE TO RELATED APPLICATIONS

The present application contains subject matter related to the following concurrently filed patent applications:

U.S. patent application Ser. No. 13/326,806 by Byung Tai Do, Arnel Senosa Trasporto and Linda Pei Ee Chua, entitled "INTEGRATED CIRCUIT PACKAGING SYSTEM WITH TERMINALS AND METHOD OF MANUFACTURE THEREOF"; and U.S. patent application Ser. No. 13/326,891 by Byung Tai Do, Arnel Senosa Trasporto and Linda Pei Ee Chua, entitled "INTEGRATED CIRCUIT PACKAGING SYSTEM WITH PACKAGE-ON-PACKAGE AND METHOD OF MANUFACTURE THEREOF".

All of the above related applications are assigned to STATS ChipPAC Ltd., and the subject matter thereof is incorporated herein by reference thereto.

TECHNICAL FIELD

The present invention relates generally to an integrated circuit packaging system, and more particularly to a system having contacts.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. In packaging components, the need for stacking more components together in a reliable manner influences manufacturing processes.

Thus, a need still remains for a more reliable connection when stacking packages. In view of the increasing prices of raw materials and shrinking sizes of connections, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming an isolated contact having a contact protrusion; forming a die paddle, adjacent to the isolated contact, having a die paddle contour; depositing a contact pad on the contact protrusion; coupling an integrated circuit die to the contact protrusion; molding an encapsulation on the integrated circuit die; and depositing an organic filler on and between the isolated contact and the die paddle, the contact protrusion extended past the organic filler.

The present invention provides an integrated circuit packaging system, including: an isolated contact having a contact protrusion; a die paddle, adjacent to the isolated contact, having a die paddle contour; a contact pad on the contact protrusion; an integrated circuit die coupled to the contact protrusion; an encapsulation on the integrated circuit die; and an organic filler on and between the isolated contact and the die paddle, the contact protrusion extended past the organic filler.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
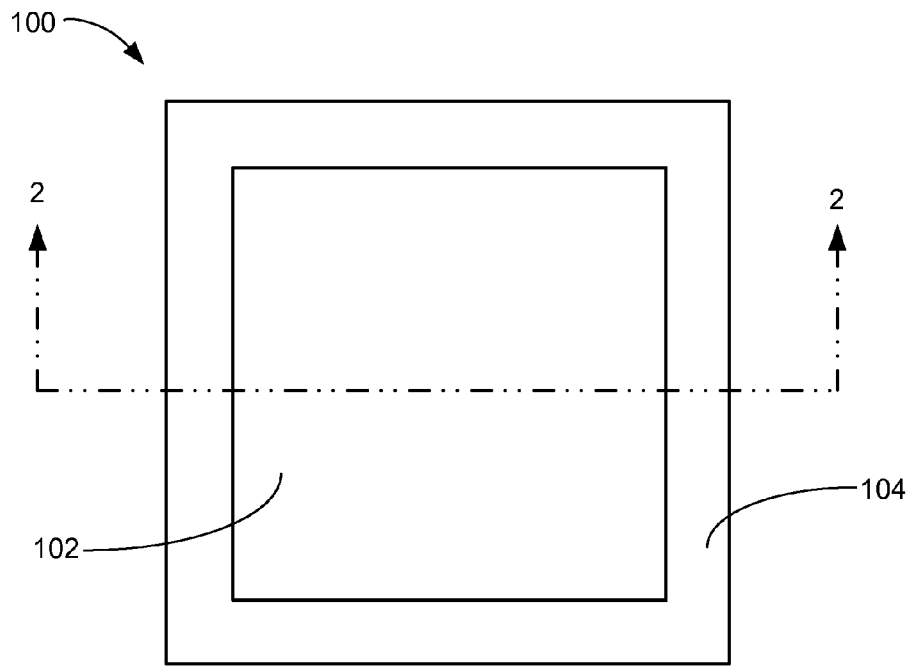
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the active side of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown having an encapsulation 102 and a substrate 104. The substrate 104 is optional for the integrated circuit packaging system 100.

The encapsulation 102 is defined as a hermetically sealed cover for surrounding and protecting the contents within the integrated circuit packaging system 100 from the environment. For example, the encapsulation 102 can be a material such as film assisted molding, epoxy molding, or other protective molding. The encapsulation 102 can function to protect sensitive components from moisture, dust and other contamination.

The substrate 104 is defined as a structure containing conductive traces and contacts. For example, the substrate 104 can be a laminate material, a metallic material, a ceramic material, or a combination thereof. The substrate 104 can have contact pads for connection to other components or next level systems. Also for example, the substrate 104 can be larger than the encapsulation 102.

For illustrative purposes, the substrate 104 is described as being larger than the encapsulation 102 although it is understood that the substrate 104 may be a different relative size. For example, the substrate 104 can be smaller or the same size as the encapsulation 102.

Figure 2:
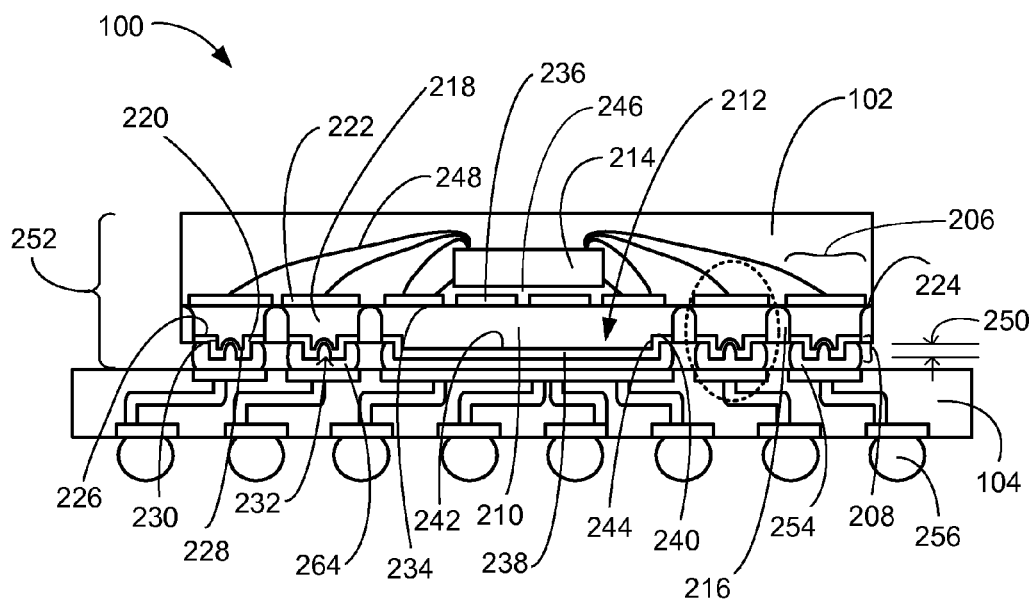
FIG. 2 is a cross-sectional view of the integrated circuit packaging system along the section line 2-2 of FIG. 1.

Referring now to FIG. 2, therein is shown a cross-sectional view of the integrated circuit packaging system 100 along the section line 2-2 of FIG. 1. The integrated circuit packaging system 100 is shown having an isolated contact 206 having a contact protrusion 208, a die paddle 210 having a die paddle contour 212, an integrated circuit die 214, an organic filler 216, the encapsulation 102, and the substrate 104, as an example.

The isolated contact 206 is defined as a standalone interconnect structure with an extended feature on the bottom. The isolated contact 206 includes a contact body 218, the contact protrusion 208, a contact pad 220, and an internal connection pad 222. The isolated contact 206 can function to serve as an external connection to other systems for the integrated circuit die 214. For example, the isolated contact 206 can connect to the substrate 104 or to a next level system (not shown). The isolated contact 206 can be exposed from the encapsulation 102, with only the internal connection pad 222 embedded in the encapsulation 102.

The contact body 218 is defined as the base structure of the isolated contact 206 from which the contact protrusion 208 extends, and the structure on which the contact pad 220 and the internal connection pad 222 can be formed. The contact body 218 can be made from different materials such as copper, tin, zinc, or other conductive metal or alloys. For example, the contact body 218 can have a distinctive shape which includes the contact protrusion 208 and a side protrusion 224.

The side protrusion 224 is defined as an extension coming out of the non-horizontal side of the isolated contact 206 or the die paddle 210. For example, the side protrusion 224 can be formed on the sides of the contact body 218 and can have different shapes. For example, if the side protrusions 224 are formed as part of an etching process, the side protrusions 224 can take the shape of a concave surface converging or merging to a point with a flat surface.

The contact protrusion 208 is defined as a portion of the contact body 218 extending from the bottom of the isolated contact 206. The structure of the contact protrusion 208 includes an upper protrusion surface 226, a lower protrusion surface 228, a protrusion sidewall 230, and a protrusion recess 232. The contact protrusion 208 can be formed in a number of ways. For example, the contact protrusion 208 can be formed by stamping, cutting, drilling, etching, or other process for physically shaping metal.

The upper protrusion surface 226 is defined as the portion of the contact protrusion 208 on the outer perimeter of the contact protrusion 208. For example, the upper protrusion surface 226 can extend from the vertical edge of the bottom of the isolated contact 206 to the protrusion sidewall 230. The upper protrusion surface 226 can be horizontally planar.

The protrusion sidewall 230 is defined as the side of the contact protrusion 208 that extends in a non-horizontal direction from the bottom of the isolated contact 206. For example, the protrusion sidewall 230 can extend from the inner edge of the upper protrusion surface 226 to the outer edge of the lower protrusion surface 228. The protrusion sidewall 230 can be curved or planar and at an angle to the upper protrusion surface 226 and the lower protrusion surface 228.

The lower protrusion surface 228 is defined as the bottom of the contact protrusion 208 inside the area defined by the protrusion sidewall 230. For example, the lower protrusion surface 228 can be at an angle to the protrusion sidewall 230 and can include the protrusion recess 232. The lower protrusion surface 228 can also be parallel with the upper protrusion surface 226, for example. The lower protrusion surface 228, the upper protrusion surface 226, the protrusion sidewall 230, and the protrusion recess 232 can be covered by the contact pad 220.

The protrusion recess 232 is defined as an indentation in the lower protrusion surface 228. For example, the protrusion recess 232 can be an indentation in the center of the lower protrusion surface 228, a groove across the center of the lower protrusion surface 228, or an indentation along the edge of the lower protrusion surface 228. The protrusion recess 232 at the edge of the lower protrusion surface 228 can also be an indentation in a portion of the protrusion sidewall 230.

It has been discovered that the contact protrusion 208 having a shape defined by the upper protrusion surface 226, the lower protrusion surface 228, the protrusion sidewall 230, and the protrusion recess 232 increases reliability of the connection between the isolated contact 206 and another system due to stronger resistance to multidirectional and shear forces in the solder used to connect the isolated contact 206 and another system. For example, because the solder will surround the contact protrusion 208, the resistance to shear forces is not determined merely by the contact adhesion but is also determined by the physical locking of the contact protrusion 208 in the solder. The lower protrusion surface 228 and the protrusion sidewall 230 extending into the solder and the solder extending into the protrusion recess 232 can help prevent the solder from breaking or delaminating due to shear forces that can be caused by a difference in the thermal expansion of the substrate 104 and a package defined by the shape of the encapsulation 102.

It has also been discovered that the increased surface area provided by the nonplanar shape of the contact protrusion 208 also can provide a stronger contact between the isolated contact 206 and the solder. For example, the upper protrusion surface 226, the lower protrusion surface 228, the protrusion sidewall 230, and the protrusion recess 232 all combine to allow for greater surface area within the same amount of horizontal space due to increased surface area in a non-horizontal direction. This can allow for greater contact between the solder and the contact protrusion 208 with a connector of the same size, and therefore a stronger connection. As another example, the increased contact surface of the contact protrusion 208 can allow the formation of smaller instances of the isolated contact 206, allowing for the same reliability as a larger instance of the isolated contact 206 without the contact protrusion 208, thereby allowing more contacts to be formed in the same size package.

The contact pad 220 is defined as a conductive material on the contact protrusion 208. The contact pad 220 can be a thin layer of conductive metal. The contact pad 220 can cover the upper protrusion surface 226, the lower protrusion surface 228, the protrusion sidewall 230, and the protrusion recess 232.

The contact pad 220 can be formed in a number of ways. For example, the contact pad 220 can be formed by a process such as sputtering, electroplating, or chemical vapor deposition (CVD). The contact pad 220 can be made from a metal such as gold, silver, nickel, an alloy thereof, other conductive metal, or a solder-wettable material.

The internal connection pad 222 is defined as a conductive material on the top of the isolated contact 206. The internal connection pad 222 can be a thin layer of conductive metal. The internal connection pad 222 can be formed in a number of ways. For example, the internal connection pad 222 can be formed by a process such as sputtering, electroplating, or chemical vapor deposition (CVD). The internal connection pad 222 can be made from a metal such as gold, silver, nickel, an alloy thereof, or other conductive material.

The die paddle 210 is defined as a supportive structure proximate to interface contacts and made from the same material as the interface contacts. For example, the die paddle 210 can include a top surface 234, a die attach pad 236, the die paddle contour 212, and a die paddle pad 238. The die paddle 210 can be made from different materials such as copper, tin, zinc, other conductive metal, or alloys thereof. For example, the die paddle 210 can have a distinctive shape which includes the die paddle contour 212 and the side protrusion 224.

The side protrusion 224 can be formed on the sides of the die paddle 210 and can have different shapes. For example, if the side protrusions 224 are formed as part of an etching process, they can take the shape of a concave surface converging or merging to a point with a flat surface.

The die attach pad 236 can be on the top surface 234 of the die paddle 210. The die attach pad 236 is defined as the location through which the integrated circuit die 214 is connected to ground. The die attach pad 236 can be a thin layer of conductive metal. The die attach pad 236 can partially cover the top surface 234 of the die attach pad 236. There can be many instances of the die attach pad 236, which can be arranged in an array on the top surface 234.

The die paddle contour 212 is defined as a portion of the die paddle 210 at the bottom of the die paddle 210 having a nonplanar shape. The structure of the die paddle contour 212 can include an upper paddle protrusion surface 240, a lower paddle protrusion surface 242, and a paddle protrusion sidewall 244. The die paddle contour 212 can be formed in a number of ways. For example, the die paddle contour 212 can be formed by stamping, cutting, drilling, etching, or other process for physically shaping metal.

The upper paddle protrusion surface 240 is defined as the portion of the die paddle contour 212 on the outer perimeter of the die paddle contour 212. For example, the upper paddle protrusion surface 240 can extend from the vertical edge of the bottom of the die paddle 210 to the paddle protrusion sidewall 244. The upper paddle protrusion surface 240 can be horizontally planar.

The paddle protrusion sidewall 244 is defined as the side of the die paddle contour 212 that extends vertically from the bottom of the isolated contact 206 or the die paddle contour 212. For example, the paddle protrusion sidewall 244 can extend from the inner edge of the upper paddle protrusion surface 240 to the outer edge of the lower paddle protrusion surface 242. The paddle protrusion sidewall 244 can be vertically planar and can be perpendicular to the upper paddle protrusion surface 240 and the lower paddle protrusion surface 242.

The lower paddle protrusion surface 242 is defined as the bottom of the die paddle contour 212 inside the area defined by the paddle protrusion sidewall 244. For example, the lower paddle protrusion surface 242 can be perpendicular to the paddle protrusion sidewall 244 and can be horizontally planar. The lower paddle protrusion surface 242 can also be parallel with the upper paddle protrusion surface 240, for example. The lower paddle protrusion surface 242, the upper paddle protrusion surface 240, and the paddle protrusion sidewall 244 can be covered by the die paddle pad 238.

It has been discovered that the die paddle contour 212 having a shape defined by the upper paddle protrusion surface 240, the lower paddle protrusion surface 242, and the paddle protrusion sidewall 244 increases reliability of the connection between the die paddle 210 and another system due to stronger resistance to multidirectional and shear forces in the solder used to connect the die paddle 210 and another system. For example, because the solder will surround the die paddle contour 212, the resistance to shear forces is not determined merely by the contact adhesion but is also determined by the physical locking of the die paddle contour 212 in the solder. The lower paddle protrusion surface 242 and the paddle protrusion sidewall 244 extending into the solder can help prevent the solder from breaking or delaminating due to shear forces that can be caused by a difference in the thermal expansion of the substrate 104 and a package defined by the shape of the encapsulation 102.

The die paddle pad 238 is defined as a conductive metal on the die paddle contour 212. The die paddle pad 238 can be a thin layer of conductive metal. The die paddle pad 238 covers only the upper paddle protrusion surface 240, the lower paddle protrusion surface 242, and the paddle protrusion sidewall 244.

The die paddle pad 238 can be formed in a number of ways. For example, the die paddle pad 238 can be formed by a process such as sputtering, electroplating, or chemical vapor deposition (CVD). The die paddle pad 238 can be made from a metal such as gold, silver, nickel, an alloy thereof, other conductive metal, or a solder-wettable material.

The integrated circuit die 214 is defined as a chip containing active circuitry. The integrated circuit die 214 can be attached to the top surface 234 of the die paddle 210 and the die attach pad 236 with a die attach adhesive 246. The integrated circuit die 214 is positioned above the die attach pad 236. The die attach adhesive 246 is defined as a substance used to bond two or more solid elements together. The die attach adhesive 246 can be a resin, glue, paste, cement, putty, or a polyvinyl resin emulsion. The die attach adhesive 246 can cover the die attach pad 236 and can partially cover the sides of the integrated circuit die 214.

The integrated circuit die 214 can be attached to the die attach pad 236 with the passive side facing down and the active side facing up. The integrated circuit die 214 can be connected to the isolated contact 206 with bond wires 248. The integrated circuit die 214 can be coupled to the contact protrusion 208 through the contact body 218. The integrated circuit die 214 can be connected to the die attach pad 236 with the bond wires 248. The die attach pad 236 can be part of a path to ground and a thermal path for the integrated circuit die 214.

The organic filler 216 is defined as a curable adhesive which also provides structural support once cured. For example, the organic filler 216 can be a curable underfill or curable epoxy which is liquid at room temperature. Also for example, the organic filler 216 can be a thermoset or a liquid curable by heat or electromagnetic radiation such as ultraviolet (UV) light.

The organic filler 216 can fully cover the sides of the isolated contact 206 and the die paddle 210, and be in direct contact with the encapsulation 102. For example, the organic filler 216 can be between and in contact with the die paddle 210 and the isolated contact 206, and level with the upper protrusion surface 226 of the isolated contact 206. The isolated contact 206 can be embedded in the organic filler 216 with the contact protrusion 208 exposed from the organic filler 216. The organic filler 216 can adhere to the encapsulation 102.

The contact protrusion 208 can extend past the external surface of the organic filler 216 and the contact pad 220 can be exposed from the organic filler 216. The organic filler 216 is shown as covering a small portion of the contact pad 220, but it is understood that this is for illustrative purposes and that the contact pad 220 can also be fully exposed from the organic filler 216. A standoff height 250 is defined as the distance between the external surface of the organic filler 216 and the contact pad 220 on the lower protrusion surface 228 of the isolated contact 206. Carefully controlling the application of the organic filler 216 can set the level of the external surface of the organic filler 216 at a level that creates the standoff height 250 exposing the contact protrusion 208. For example, the standoff height 250 can be 20% to 50% of the height of the isolated contact 206.

It has been discovered that the organic filler 216 covering the sides of the isolated contact 206 while leaving the standoff height 250 exposing the contact protrusion 208 can improve the reliability of the integrated circuit packaging system 100 due to a terminal locking effect of the isolated contact 206 in the organic filler 216 while also providing a strong connection to the contact protrusion 208. For example, because the side protrusions 224 of the isolated contact 206 are fully embedded in the organic filler 216, which is also adhered to the encapsulation 102, the isolated contact 206 can be resistant to lead pull out which can lead to subsequent board-level failure. The contact protrusion 208 exposed from the organic filler 216 can allow a strong connection to a next level system (not shown) while also having a strong resistance to lead pull out.

An integrated circuit package 252 includes the isolated contact 206, the die paddle 210, the organic filler 216, the integrated circuit die 214, and the encapsulation 102. The organic filler 216 separates a plurality of the isolated contact 206 and with the encapsulation 102 maintains the structure of the integrated circuit package 252.

The encapsulation 102 can have a planar surface on the top and sides of the encapsulation 102. The encapsulation 102 can be in direct contact with the organic filler 216 on the bottom surface of the encapsulation between the die paddle 210 and the isolated contact 206. The organic filler 216 can leave exposed the bottom of the isolated contact 206 and the die paddle 210.

The substrate 104 can be a structure with conductive traces. For example, the substrate 104 can be a laminate material, metallic, ceramic, or some combination thereof. The substrate 104 includes a substrate contact 264.

Conductive material 254 is defined as a metallic mixture used to bridge contacts. For example, the conductive material 254 can be solder, a conductive paste, or a conductive resin. The conductive material 254 can bridge different kinds of contacts. For example, the conductive material 254 can connect the isolated contact 206 and the substrate contact 264. Also for example, the conductive material 254 can connect the die paddle 210 and the substrate contact 264.

The conductive material 254 can conform to the contact pad 220 if the contact pad 220 is formed from solder-wettable material. For example, the conductive material 254 can cover the upper protrusion surface 226, the lower protrusion surface 228, and the protrusion sidewall 230, while also filling the space in the protrusion recess 232. The standoff height 250 can allow the conductive material 254 to contact the contact pad 220 on all the surfaces of the contact protrusion 208 because the surfaces can be exposed from the organic filler 216.

The substrate 104 can have system interconnects 256. The system interconnects 256 are defined as an external connection for connection to a next level system (not shown). The system interconnects 256 can be solder balls, solder bumps, solder columns, gold bumps, or stud bumps.

Figure 3:
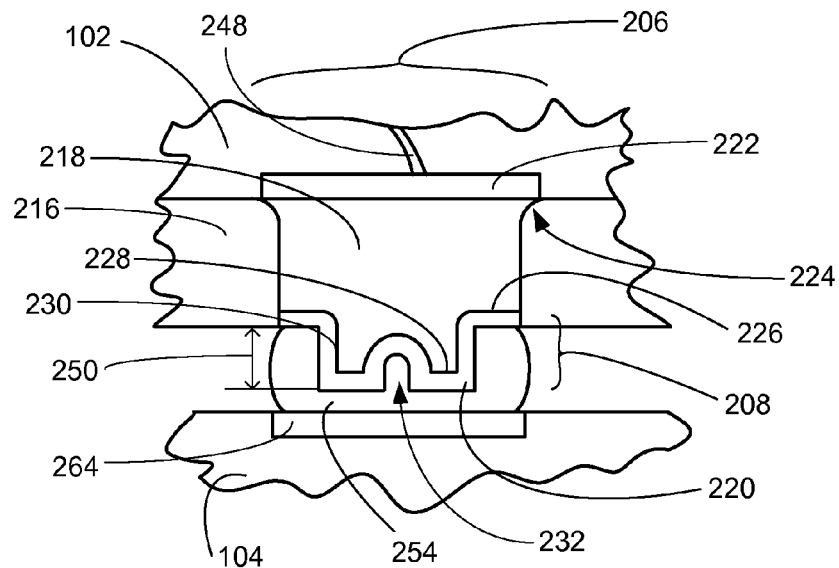
FIG. 3 is a partial cross-sectional view of the integrated circuit packaging system in the inset of FIG. 2 depicted by the dotted oval.

Referring now to FIG. 3, therein is shown a partial cross-sectional view of the integrated circuit packaging system 100 in the inset of FIG. 2 depicted by the dotted oval. The partial cross-sectional view of the integrated circuit packaging system 100 is shown having the isolated contact 206, the conductive material 254, the bond wire 248, the encapsulation 102, and the substrate 104. Features shown are identical to those shown in FIG. 2 but are shown larger and further described for clarity.

The isolated contact 206 includes the contact body 218, the contact protrusion 208, and the contact pad 220. The isolated contact 206 can function as an external connection to other systems. For example, the isolated contact 206 can connect to the substrate 104 or to a next level system. The isolated contact 206 can be partially embedded in the organic filler 216, leaving the contact protrusion 208 and the contact pad 220 exposed.

The contact body 218 is the base structure of the isolated contact 206 from which the contact protrusion 208 extends, and the structure on which the contact pad 220 and the internal connection pad 222 can be formed. The contact body 218 can be made from many different materials such as copper, tin, zinc, or other conductive metal or alloys. For example, the contact body 218 can have a distinctive shape which includes the contact protrusion 208 and the side protrusion 224.

The side protrusion 224 can be an extension coming out of the non-horizontal side of the isolated contact 206. For example, the side protrusion 224 can be formed on the sides of the contact body 218 and can have different shapes. For example, if the side protrusions 224 are formed as part of an etching process, the side protrusions 224 can take the shape of a concave surface converging or merging to a point with a flat surface.

The contact protrusion 208 is a portion of the contact body 218 extending from the bottom of the isolated contact 206. The structure of the contact protrusion 208 includes the upper protrusion surface 226, the lower protrusion surface 228, the protrusion sidewall 230, and the protrusion recess 232. The contact protrusion 208 can be formed in a number of ways. For example, the contact protrusion 208 can be formed by stamping, cutting, drilling, etching, or other process for physically shaping metal.

The upper protrusion surface 226 includes the portion of the contact protrusion 208 on the outer perimeter of the contact protrusion 208. For example, the upper protrusion surface 226 can extend from the non-horizontal edge of the bottom of the isolated contact 206 to the protrusion sidewall 230. The upper protrusion surface 226 can be horizontally planar.

The protrusion sidewall 230 can be the side of the contact protrusion 208 that extends in a non-horizontal direction from the bottom of the isolated contact 206. For example, the protrusion sidewall 230 can extend from the inner edge of the upper protrusion surface 226 to the outer edge of the lower protrusion surface 228. The protrusion sidewall 230 can be curved or planar and at an angle to the upper protrusion surface 226 and the lower protrusion surface 228.

The lower protrusion surface 228 is defined as the bottom of the contact protrusion 208 inside the area defined by the protrusion sidewall 230. For example, the lower protrusion surface 228 can be at an angle to the protrusion sidewall 230 and can include the protrusion recess 232. The lower protrusion surface 228 can also be parallel with the upper protrusion surface 226, for example. The lower protrusion surface 228, the upper protrusion surface 226, the protrusion sidewall 230, and the protrusion recess 232 can be covered by the contact pad 220.

The protrusion recess 232 is an indentation in the lower protrusion surface 228. For example, the protrusion recess 232 can be an indentation in the center of the lower protrusion surface 228, a groove across the center of the lower protrusion surface 228, or an indentation along the edge of the lower protrusion surface 228. The protrusion recess 232 at the edge of the lower protrusion surface 228 can also be an indentation in a portion of the protrusion sidewall 230.

The contact pad 220 can be a conductive material on the contact protrusion 208. The contact pad 220 can be a thin layer of conductive metal. The contact pad 220 covers only the upper protrusion surface 226, the lower protrusion surface 228, the protrusion sidewall 230, and the protrusion recess 232.

The contact pad 220 can be formed in a number of ways. For example, the contact pad 220 can be formed by a process such as sputtering, electroplating, or chemical vapor deposition (CVD). The contact pad 220 can be made from a metal such as gold, silver, nickel, an alloy thereof, other conductive metal, or a solder-wettable material.

The organic filler 216 is a curable adhesive which also provides structural support once cured. For example, the organic filler 216 can be a curable underfill or curable epoxy which is liquid at room temperature. For example, the organic filler 216 can be a liquid curable by heat or electromagnetic radiation such as ultraviolet (UV) light.

The organic filler 216 can fully cover the sides of the isolated contact 206 and be in direct contact with the encapsulation 102. For example, the organic filler 216 can be level with the upper protrusion surface 226 of the isolated contact 206. The isolated contact 206 can be embedded in the organic filler 216 with the contact protrusion 208 exposed from the organic filler 216. The organic filler 216 can adhere to the encapsulation 102. The encapsulation 102 can be on the bond wire 248 and the internal connection pad 222.

The contact protrusion 208 can extend past the external surface of the organic filler 216 and the contact pad 220 can be exposed from the organic filler 216. The organic filler 216 is shown as covering a small portion of the contact pad 220, but it is understood that this is for illustrative purposes and that the contact pad 220 can also be fully exposed from the organic filler 216. The standoff height 250 is the distance between the external surface of the organic filler 216 and the contact pad 220 on the lower protrusion surface 228 of the isolated contact 206. Carefully controlling the application of the organic filler 216 can set the level of the external surface of the organic filler 216 at a level that creates the standoff height 250 exposing the contact protrusion 208. For example, the standoff height 250 can be 20% to 50% of the height of the isolated contact 206.

The internal connection pad 222 is a conductive material on the top of the isolated contact 206. The internal connection pad 222 can be a thin layer of conductive metal. The internal connection pad 222 covers only the top of the isolated contact 206. The internal connection pad 222 can be formed in a number of ways. For example, the internal connection pad 222 can be formed by a process such as sputtering, electroplating, or chemical vapor deposition (CVD). The internal connection pad 222 can be made from a metal such as gold, silver, nickel, copper, other conductive material. The internal connection pad 222 is shown directly connected to the bond wire 248.

The substrate 104 can be a structure containing conductive traces and contacts. For example, the substrate 104 can be a laminate material, metallic, or some combination thereof. The substrate 104 includes the substrate contact 264.

The conductive material 254 can be a metallic mixture used to bridge contacts. For example, the conductive material 254 can be solder, a conductive paste, or a conductive resin. The conductive material 254 can bridge different kinds of contacts. For example, the conductive material 254 can connect the isolated contact 206 and the substrate contact 264. Also for example, the conductive material 254 can connect the die paddle 210 and the substrate contact 264.

The conductive material 254 can conform to the contact pad 220 if the contact pad 220 is formed from solder-wettable material. For example, the conductive material 254 can cover the upper protrusion surface 226, the lower protrusion surface 228, the protrusion sidewall 230, and the protrusion recess 232 while not covering the contact body 218.

Figure 4:
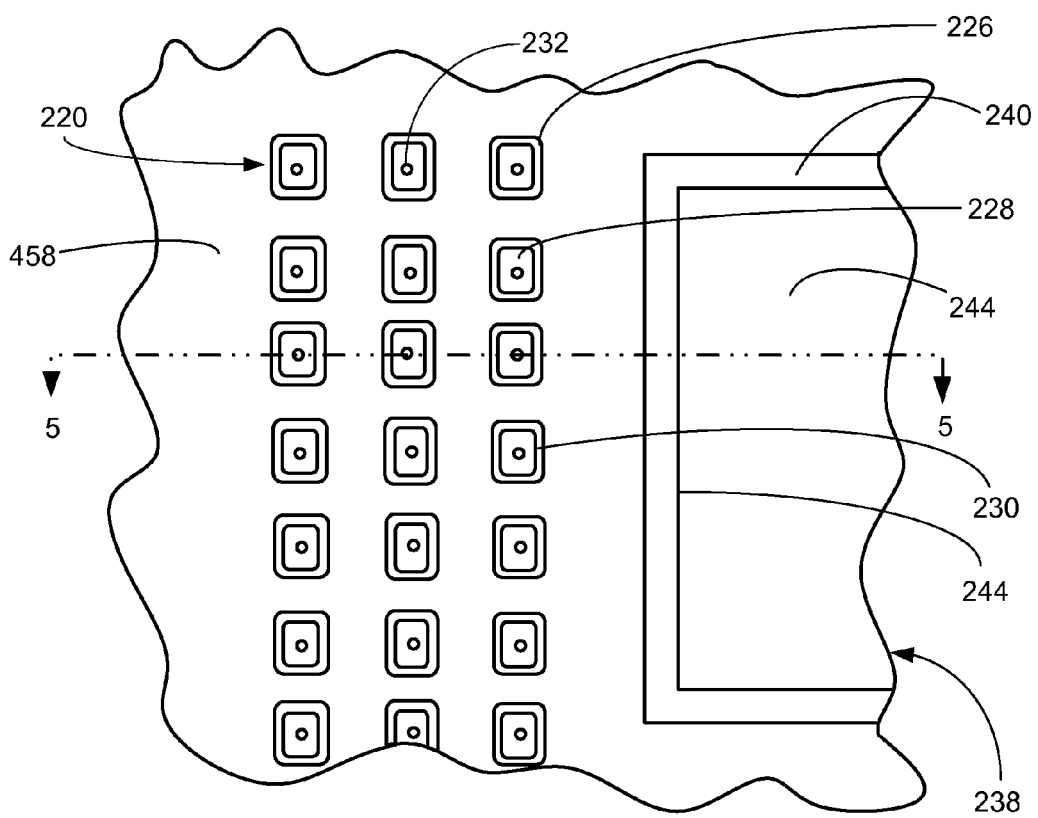
FIG. 4 is a partial bottom view of a leadframe and the contact pad in a manufacturing step of the integrated circuit packaging system.

Referring now to FIG. 4, therein is shown a partial bottom view of a leadframe 458 and the contact pad 220 in a manufacturing step of the integrated circuit packaging system 100. The leadframe 458 is shown having the contact pad 220 and the die paddle pad 238.

The leadframe 458 is defined as a contiguous conductive structure. The leadframe 458 can be processed before further manufacturing steps are performed. For example, the leadframe 458 can have the contact pad 220 and the die paddle pad 238 deposited on it via a process such as sputtering, electroplating, or chemical vapor deposition (CVD). The contact pad 220 and the die paddle pad 238 can be made from a metal such as gold, silver, nickel, an alloy thereof, other conductive metal, or other solder-wettable material. Also for example, in order to assure that the contact pad 220 is only deposited where desired, the leadframe 458 can be masked before plating.

The contact pad 220 and the die paddle pad 238 can be deposited in different sizes and patterns. For example, the die paddle pad 238 can be deposited in an array on the leadframe 458 surrounded by the contact pad 220 and can be larger, smaller, or the same size as the contact pad 220. The contact pad 220 can be deposited around the die paddle pad 238 in different patterns. For example, the contact pad 220 can be deposited around the die paddle pad 238 in staggered rows, in a grid, or other regular pattern. The staggered row pattern can allow for closer packing of the contact pad 220; more instances of the contact pad 220 can be fit into the same amount of space.

The shape of the contact pad 220 is defined by the contact protrusion 208 of FIG. 2. The structure of the contact protrusion 208 includes the upper protrusion surface 226, the lower protrusion surface 228, the protrusion sidewall 230, and the protrusion recess 232. The contact protrusion 208 can be formed in a number of ways. For example, the contact protrusion 208 can be formed by stamping, cutting, drilling, etching, or other process for physically shaping the leadframe 458. The shape of the protrusion recess 232 shown is an example, and the protrusion recess 232 can take other shapes. For example, the protrusion recess 232 can be an indentation in the center of the lower protrusion surface 228, a groove across the center of the lower protrusion surface 228, or an indentation along the edge of the lower protrusion surface 228. The protrusion recess 232 at the edge of the lower protrusion surface 228 can also be an indentation in a portion of the protrusion sidewall 230.

The shape of the die paddle pad 238 is defined by the die paddle contour 212 of FIG. 2. The structure of the die paddle contour 212 can include the upper paddle protrusion surface 240, the lower paddle protrusion surface 242, and the paddle protrusion sidewall 244. The die paddle contour 212 can be formed in a number of ways. For example, the die paddle contour 212 can be formed by stamping, cutting, drilling, etching, or other process for physically shaping the leadframe 458.

Figure 5:
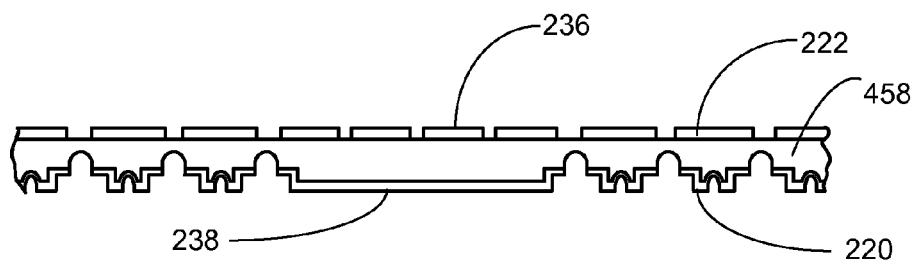
FIG. 5 is a partial cross-sectional view of the leadframe along the section line 5-5 of FIG. 4.

Referring now to FIG. 5, therein is shown a partial cross-sectional view of the leadframe 458 along the section line 5-5 of FIG. 4. There are multiple steps taken in order to form the isolated contact 206 of FIG. 2 and the die paddle 210 of FIG. 2. For example, the leadframe 458 can be etched before further processing. Before etching, the contact pad 220, the internal connection pad 222, the die attach pad 236, and the die paddle pad 238 can be applied to the top and bottom of the leadframe 458.

The contact pad 220 and the die paddle pad 238 can resist the etching process and the leadframe 458 can be etched partially through bottom side of the leadframe 458, leaving recesses in the leadframe 458 between the areas covered by the contact pad 220 and the die paddle pad 238. For example, the recesses can be of a depth so half the thickness of the leadframe 458 remains between the bottom of the recess and the component side of the leadframe 458.

The recesses can have curved corners as a result of the etching process. The leadframe 458 can be formed having the contact protrusion 208 of FIG. 2 in a number of ways. For example, the shape of the leadframe 458 can be formed by stamping, sawing, laser cutting, etching, or other process that can shape metal.

Figure 6:
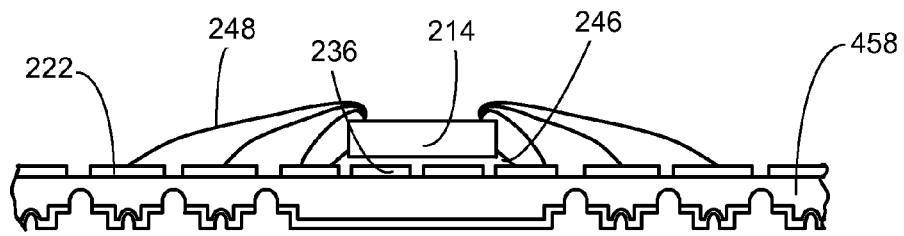
FIG. 6 is the structure of FIG. 5 in coupling the integrated circuit die to the leadframe.

Referring now to FIG. 6, therein is shown the structure of FIG. 5 in coupling the integrated circuit die 214 to the leadframe 458. Shown is the integrated circuit die 214, the die attach adhesive 246, the bond wires 248, the internal connection pad 222, and the die attach pad 236.

The integrated circuit die 214 can be attached to the die attach pad 236 with the die attach adhesive 246. The integrated circuit die 214 can then be connected to the internal connection pad 222 by attaching the bond wires 248 from the active side of the integrated circuit die 214 to the internal connection pad 222. The integrated circuit die 214 can be connected to ground through the die attach pad 236 and the bond wires 248.

Figure 7:
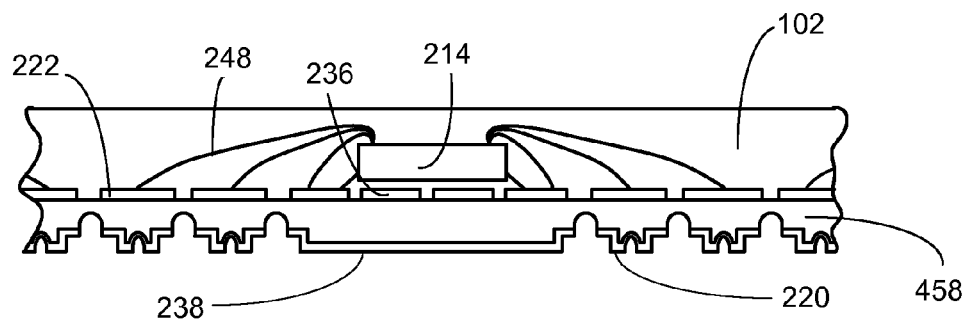
FIG. 7 is the structure of FIG. 6 after encapsulation.

Referring now to FIG. 7, therein is shown the structure of FIG. 6 after encapsulation. The encapsulation 102 is molded to the component side of the leadframe 458.

The encapsulation 102 can be molded over many components. For example, the encapsulation 102 can cover the integrated circuit die 214, the bond wires 248, the component side of the leadframe 458, the internal connection pad 222, and the die attach pad 236. The encapsulation 102 can cover only the component side of the leadframe 458 so as to leave the contact pad 220 and the die paddle pad 238 exposed on the system side of the leadframe 458.

Figure 8:
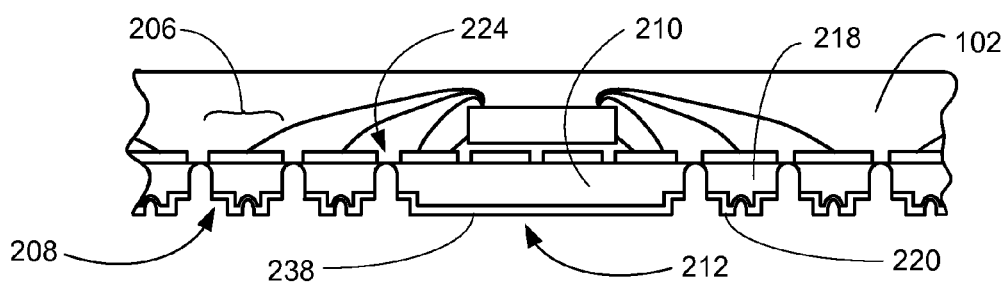
FIG. 8 is the structure of FIG. 7 in forming the isolated contact and the die paddle.

Referring now to FIG. 8, therein is shown the structure of FIG. 7 in forming the isolated contact 206 and the die paddle 210. The leadframe 458 of FIG. 4 can be eroded from between the contact pad 220 and the die paddle pad 238 to form the isolated contact 206 and the die paddle 210 in different ways. For example, an etching step can etch through the remaining thickness of the previously etched portions of the leadframe 458 and fully isolate the instances of the isolated contact 206 from each other and from the die paddle 210. Also for example, the etching step can etch through the leadframe 458 only in the areas not covered by the contact pad 220 and the die paddle pad 238.

After the etching step, the isolated contact 206 and the die paddle 210 can have different features. For example, the isolated contact 206 and the die paddle 210 can have the side protrusions 224 on the sides of the isolated contact 206 and the die paddle 210. The etching step can expose part of the contact body 218 and the die paddle 210 above the contact protrusion 208 and the die paddle contour 212. Also for example, the encapsulation 102 can be exposed at the bottom of the structure of FIG. 8 between the isolated contact 206 and the die paddle 210 and the encapsulation 102 can be exposed at the bottom of the structure of FIG. 8 between instances of the isolated contact 206.

For illustrative purposes, the leadframe 458 is described as being removed from between the isolated contact 206 and the die paddle 210 with etching, though it is understood that the removal can be done differently. For example, the leadframe 458 can be removed by a process such as drilling or cutting.

Figure 9:
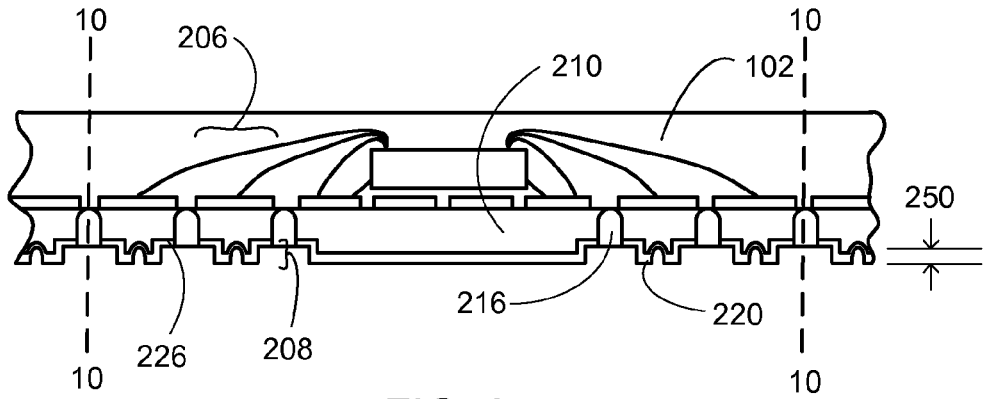
FIG. 9 is the structure of FIG. 8 in depositing the organic filler on the isolated contact and the die paddle.

Referring now to FIG. 9, therein is shown the structure of FIG. 8 in depositing the organic filler 216 on the isolated contact 206 and the die paddle 210. The organic filler 216 can be deposited between the isolated contact 206 and the die paddle 210. The organic filler 216 can have an external surface that is at the same level as the upper protrusion surface 226 or the contact pad 220 on the upper protrusion surface 226.

The organic filler 216 can be deposited in various ways. For example, the organic filler 216 can be deposited by a controlled injection from the side to prevent contamination of the contact pad 220, or the organic filler 216 can be applied after masking or silkscreening. The organic filler 216 can fill the space between instances of the isolated contact 206 and can have adhesive properties so as to adhere to the encapsulation 102. Once the organic filler 216 has been deposited, a curing step such as heat or UV light can harden the organic filler 216.

The organic filler 216 can be deposited such that the contact protrusion 208 is exposed from the organic filler 216 and extends past the external surface of the organic filler 216 to create the standoff height 250 between the lower protrusion surface 228 and the external surface of the organic filler 216.

Figure 10:
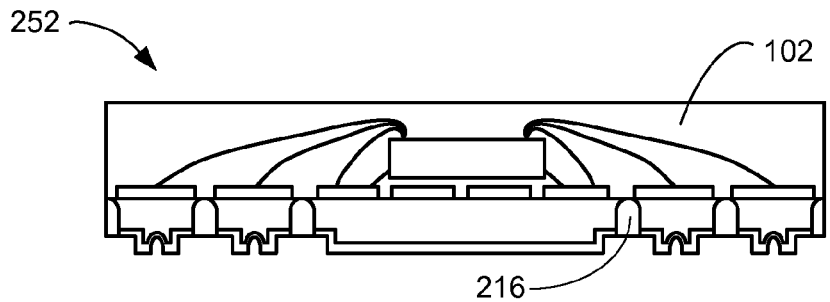
FIG. 10 is the structure of FIG. 9 after singulation along the singulation lines 10-10 of FIG. 9.

Referring now to FIG. 10, therein is shown the structure of FIG. 9 after singulation along the singulation lines 10-10 of FIG. 9. The structure of FIG. 8 is singulated by cutting through only the encapsulation 102 and the organic filler 216 to form the integrated circuit package 252.

The encapsulation 102 and the organic filler 216 can be separated in different ways. For example, the encapsulation 102 and the organic filler 216 can be singulated by cutting, lasering, shearing, or sawing. The singulation process can produce the integrated circuit package 252 which is the top section of the integrated circuit packaging system 100 of FIG. 2. The singulation process can create a vertical planar edge of the encapsulation 102 and the organic filler 216 at the sides of the integrated circuit package 252.

Figure 11:
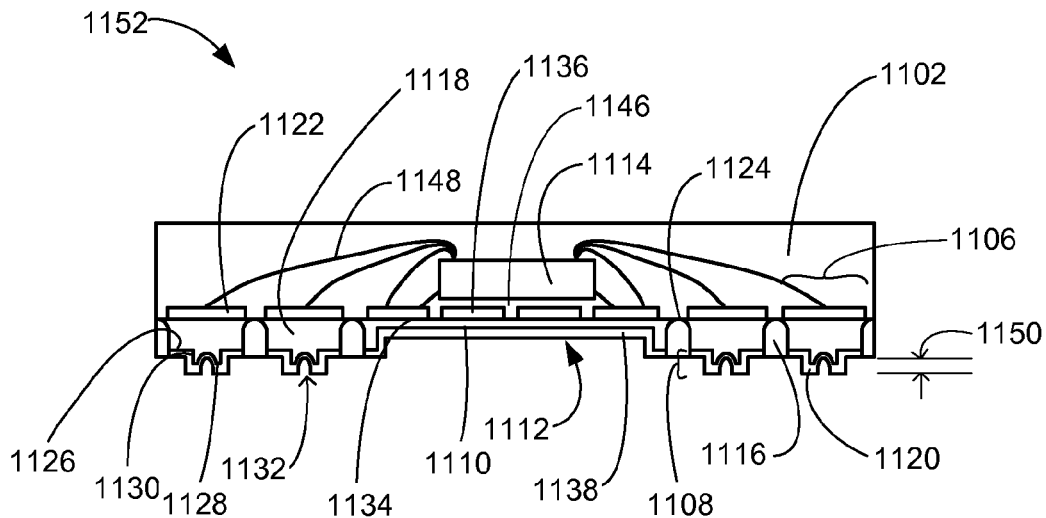
FIG. 11 is a cross-sectional view of the integrated circuit package without the substrate as exemplified by the top view of FIG. 1 and along the section line 2-2 of FIG. 1 in a second embodiment of the present invention.

Referring now to FIG. 11, therein is shown a cross-sectional view of the integrated circuit package 1152 without the substrate 104 of FIG. 1 as exemplified by the top view of FIG. 1 and along the section line 2-2 of FIG. 1 in a second embodiment of the present invention. The integrated circuit package 1152 is shown having an isolated contact 1106 having a contact protrusion 1108, a die paddle 1110 having a die paddle contour 1112, an integrated circuit die 1114, and an organic filler 1116, as an example.

The isolated contact 1106 is defined as a standalone interconnect structure with an extended feature on the bottom. The isolated contact 1106 includes a contact body 1118, the contact protrusion 1108, a contact pad 1120, and an internal connection pad 1122. The isolated contact 1106 can function to serve as an external connection to other systems for the integrated circuit die 1114. For example, the isolated contact 1106 can connect to a substrate 1104 or to a next level system (not shown). The isolated contact 1106 can be exposed from an encapsulation 1102, with only the internal connection pad 1122 embedded in the encapsulation 1102.

The contact body 1118 is defined as the base structure of the isolated contact 1106 from which the contact protrusion 1108 extends, and the structure on which the contact pad 1120 and the internal connection pad 1122 can be formed. The contact body 1118 can be made from many different materials such as copper, tin, zinc, or other conductive metal or alloys. For example, the contact body 1118 can have a distinctive shape which includes the contact protrusion 1108 and a side protrusion 1124.

The side protrusion 1124 is defined as an extension coming out of the non-horizontal side of the isolated contact 1106 or the die paddle 1110. For example, the side protrusion 1124 can be formed on the sides of the contact body 1118 and can have different shapes. For example, if the side protrusions 1124 are formed as part of an etching process, the side protrusions 1124 can take the shape of a concave surface converging or merging to a point with a flat surface.

The contact protrusion 1108 is defined as a portion of the contact body 1118 extending from the bottom of the isolated contact 1106. The structure of the contact protrusion 1108 includes an upper protrusion surface 1126, a lower protrusion surface 1128, a protrusion sidewall 1130, and a protrusion recess 1132. The contact protrusion 1108 can be formed in a number of ways. For example, the contact protrusion 1108 can be formed by stamping, cutting, drilling, etching, or other process for physically shaping metal.

The upper protrusion surface 1126 is defined as the portion of the contact protrusion 1108 on the outer perimeter of the contact protrusion 1108. For example, the upper protrusion surface 1126 can extend from the vertical edge of the bottom of the isolated contact 1106 to the protrusion sidewall 1130. The upper protrusion surface 1126 can be horizontally planar.

The protrusion sidewall 1130 is defined as the side of the contact protrusion 1108 that extends in a non-horizontal direction from the bottom of the isolated contact 1106. For example, the protrusion sidewall 1130 can extend from the inner edge of the upper protrusion surface 1126 to the outer edge of the lower protrusion surface 1128. The protrusion sidewall 1130 can be curved or planar and at an angle to the upper protrusion surface 1126 and the lower protrusion surface 1128.

The lower protrusion surface 1128 is defined as the bottom of the contact protrusion 1108 inside the area defined by the protrusion sidewall 1130. For example, the lower protrusion surface 1128 can be at an angle to the protrusion sidewall 1130 and can include the protrusion recess 1132. The lower protrusion surface 1128 can also be parallel with the upper protrusion surface 1126, for example. The lower protrusion surface 1128, the upper protrusion surface 1126, the protrusion sidewall 1130, and the protrusion recess 1132 can be covered by the contact pad 1120.

The protrusion recess 1132 is defined as an indentation in the lower protrusion surface 1128. For example, the protrusion recess 1132 can be an indentation in the center of the lower protrusion surface 1128, a groove across the center of the lower protrusion surface 1128, or an indentation along the edge of the lower protrusion surface 1128. The protrusion recess 1132 at the edge of the lower protrusion surface 1128 can also be an indentation in a portion of the protrusion sidewall 1130.

It has been discovered that the contact protrusion 1108 having a shape defined by the upper protrusion surface 1126, the lower protrusion surface 1128, the protrusion sidewall 1130, and the protrusion recess 1132 increases reliability of the connection between the isolated contact 1106 and another system due to stronger resistance to multidirectional and shear forces in the solder used to connect the isolated contact 1106 and another system. For example, because the solder will surround the contact protrusion 1108, the resistance to shear forces is not determined merely by the contact adhesion but is also determined by the physical locking of the contact protrusion 1108 in the solder. The lower protrusion surface 1128 and the protrusion sidewall 1130 extending into the solder and the solder extending into the protrusion recess 1132 can help prevent the solder from breaking or delaminating due to shear forces that can be caused by a difference in the thermal expansion of the substrate 1104 and a package defined by the shape of the encapsulation 1102.

It has also been discovered that the increased surface area provided by the nonplanar shape of the contact protrusion 1108 also can provide a stronger contact between the isolated contact 1106 and the solder. For example, the upper protrusion surface 1126, the lower protrusion surface 1128, the protrusion sidewall 1130, and the protrusion recess 1132 all combine to allow for greater surface area within the same amount of horizontal space due to increased surface area in a non-horizontal direction. This can allow for greater contact between the solder and the contact protrusion 1108, and therefore a stronger connection. As another example, the increased contact surface of the contact protrusion 1108 can allow the formation of smaller instances of the isolated contact 1106, allowing for the same reliability as a larger instance of the isolated contact 1106 without the contact protrusion 1108, thereby allowing more contacts to be formed in the same size package.

The contact pad 1120 is defined as a conductive material on the contact protrusion 1108. The contact pad 1120 can be a thin layer of conductive metal. The contact pad 1120 can cover the upper protrusion surface 1126, the lower protrusion surface 1128, the protrusion sidewall 1130, and the protrusion recess 1132.

The contact pad 1120 can be formed in a number of ways. For example, the contact pad 1120 can be formed by a process such as sputtering, electroplating, or chemical vapor deposition (CVD). The contact pad 1120 can be made from a metal such as gold, silver, nickel, an alloy thereof, other conductive metal, or a solder-wettable material.

The internal connection pad 1122 is defined as a conductive material on the top of the isolated contact 1106. The internal connection pad 1122 can be a thin layer of conductive metal. The internal connection pad 1122 can be formed in a number of ways. For example, the internal connection pad 1122 can be formed by a process such as sputtering, electroplating, or chemical vapor deposition (CVD). The internal connection pad 1122 can be made from a metal such as gold, silver, nickel, an alloy thereof, or other conductive material.

The die paddle 1110 is defined as a supportive structure proximate to interface contacts and made from the same material as the interface contacts. For example, the die paddle 1110 can include a top surface 1134, a die attach pad 1136, the die paddle contour 1112, and a die paddle pad 1138. The die paddle 1110 can be made from different materials such as copper, tin, zinc, other conductive metal, or alloys thereof. For example, the die paddle 1110 can have a distinctive shape which includes the die paddle contour 1112 and the side protrusion 1124.

The side protrusion 1124 can be formed on the sides of the die paddle 1110 and can have different shapes. For example, if the side protrusions 1124 are formed as part of an etching process, they can take the shape of a concave surface converging or merging to a point with a flat surface.

The die attach pad 1136 can be on the top surface 1134 of the die paddle 1110. The die attach pad 1136 is defined as the location through which the integrated circuit die 1114 is connected to ground. The die attach pad 1136 can be a thin layer of conductive metal. The die attach pad 1136 can partially cover the top surface 1134 of the die attach pad 1136. There can be many instances of the die attach pad 1136, which can be arranged in an array on the top surface 1134.

The die paddle contour 1112 is defined as a portion of the die paddle 1110 at the bottom of the die paddle 1110 having a nonplanar shape. The structure of the die paddle contour 1112 can include a clearance space under the die paddle 1110. The die paddle contour 1112 can be formed in a number of ways. For example, the die paddle contour 1112 can be formed by stamping, cutting, drilling, etching, or other process for physically shaping metal.

The clearance space under the die paddle 1110 can be an indentation in the bottom of the die paddle 1110. For example, the clearance space can allow the integrated circuit package 1152 to be mounted over another chip or on a ball-grid array (BGA) package. The die paddle pad 1138 can be on the bottom of the die paddle 1110 covering the indentation in the die paddle 1110 that creates the clearance space. The die paddle pad 1138 can protect the body of the die paddle 1110 during the etching process to separate the die paddle 1110 from the isolated contact 1106.

The die paddle pad 1138 is defined as a conductive metal on the die paddle contour 1112. The die paddle pad 1138 can be a thin layer of conductive metal. The die paddle pad 1138 covers only the bottom of the die paddle 1110.

The die paddle pad 1138 can be formed in a number of ways. For example, the die paddle pad 1138 can be formed by a process such as sputtering, electroplating, or chemical vapor deposition (CVD). The die paddle pad 1138 can be made from a metal such as gold, silver, nickel, an alloy thereof, other conductive metal, or a solder-wettable material.

The integrated circuit die 1114 is defined as a chip containing active circuitry. The integrated circuit die 1114 can be attached to the top surface 1134 of the die paddle 1110 and the die attach pad 1136 with a die attach adhesive 1146. The integrated circuit die 1114 is positioned above the die attach pad 1136 on the die attach adhesive 1146. The die attach adhesive 1146 is defined as a substance used to bond two or more solid elements together. The die attach adhesive 1146 can be a resin, glue, paste, cement, putty, or a polyvinyl resin emulsion. The die attach adhesive 1146 can cover the die attach pad 1136 and can partially cover the sides of the integrated circuit die 1114.

The integrated circuit die 1114 can be attached to the die attach pad 1136 with the passive side facing down and the active side facing up. The integrated circuit die 1114 can be connected to the isolated contact 1106 with bond wires 1148. The integrated circuit die 1114 can be connected to the die attach pad 1136 with the bond wires 1148. The die attach pad 1136 can be part of a path to ground and a thermal path for the integrated circuit die 1114.

The organic filler 1116 is defined as a curable adhesive which also provides structural support once cured. For example, the organic filler 1116 can be a curable underfill or curable epoxy which is liquid at room temperature. For example, the organic filler 1116 can be a liquid curable by heat or electromagnetic radiation such as ultraviolet (UV) light.

The organic filler 1116 can fully cover the sides of the isolated contact 1106 and the die paddle 1110, and be in direct contact with the encapsulation 1102. For example, the organic filler 1116 can be between and in contact with the die paddle 1110 and the isolated contact 1106, and level with the upper protrusion surface 1126 of the isolated contact 1106. The isolated contact 1106 can be embedded in the organic filler 1116 with the contact protrusion 1108 exposed from the organic filler 1116. The organic filler 1116 can adhere to the encapsulation 1102.

The contact protrusion 1108 can extend past the external surface of the organic filler 1116 and the contact pad 1120 can be exposed from the organic filler 1116. The organic filler 1116 is shown as covering a small portion of the contact pad 1120, but it is understood that this is for illustrative purposes and that the contact pad 1120 can also be fully exposed from the organic filler 1116. A standoff height 1150 is defined as the distance between the external surface of the organic filler 1116 and the contact pad 1120 on the lower protrusion surface 1128 of the isolated contact 1106. Carefully controlling the application of the organic filler 1116 can set the level of the external surface of the organic filler 1116 at a level that creates the standoff height 1150 exposing the contact protrusion 1108. For example, the standoff height 1150 can be 20% to 50% of the height of the isolated contact 1106.

It has been discovered that the organic filler 1116 covering the sides of the isolated contact 1106 while leaving the standoff height 1150 exposing the contact protrusion 1108 can improve the reliability of the integrated circuit package 1152 due to a terminal locking effect of the isolated contact 1106 in the organic filler 1116 while also providing a strong connection to the contact protrusion 1108. For example, because the side protrusions 1124 of the isolated contact 1106 are fully embedded in the organic filler 1116, which is also adhered to the encapsulation 1102, the isolated contact 1106 can be resistant to lead pull out which can lead to subsequent board-level failure. The contact protrusion 1108 exposed from the organic filler 1116 can allow a strong connection to a next level system (not shown) while also having a strong resistance to lead pull out.

The organic filler 1116 separates a plurality of the isolated contact 1106 and with the encapsulation 1102 maintains the structure of the integrated circuit package 1152. The encapsulation 1102 can have a planar surface on the top and sides of the encapsulation 1102. The encapsulation 1102 can be in direct contact with the organic filler 1116 on the bottom surface of the encapsulation between the die paddle 1110 and the isolated contact 1106. The organic filler 1116 can leave exposed the bottom of the isolated contact 1106 and the die paddle 1110.

Figure 12:
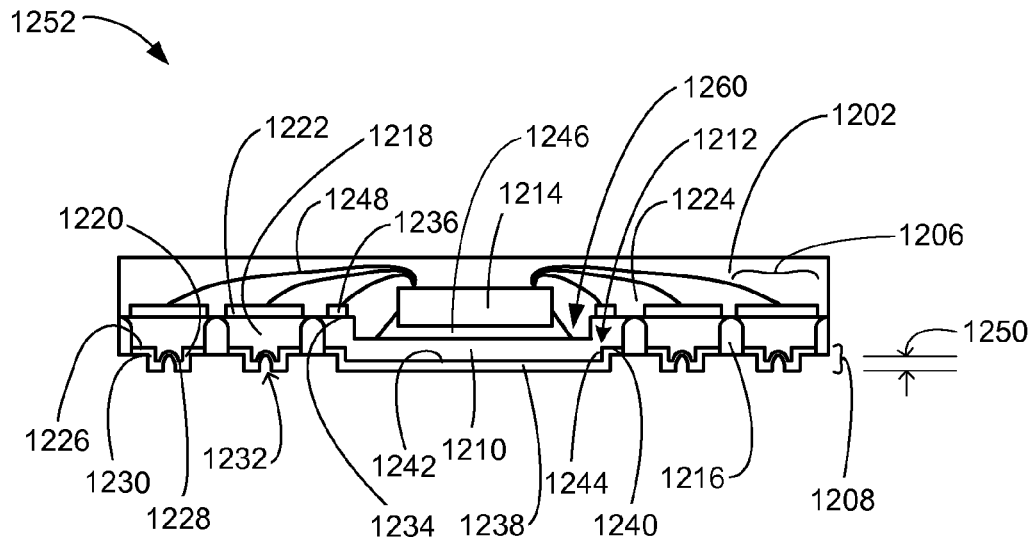
FIG. 12 is a cross-sectional view of the integrated circuit package without the substrate as exemplified by the top view of FIG. 1 and along the section line 2-2 of FIG. 1 in a third embodiment of the present invention.

Referring now to FIG. 12, therein is shown a cross-sectional view of the integrated circuit package 1252 without the substrate 104 of FIG. 1 as exemplified by the top view of FIG. 1 and along the section line 2-2 of FIG. 1 in a third embodiment of the present invention. The integrated circuit package 1252 is shown having an isolated contact 1206 having a contact protrusion 1208, a die paddle 1210 having a die paddle contour 1212, an integrated circuit die 1214, and an organic filler 1216, as an example.

The isolated contact 1206 is defined as a standalone interconnect structure with an extended feature on the bottom. The isolated contact 1206 includes a contact body 1218, the contact protrusion 1208, a contact pad 1220, and an internal connection pad 1222. The isolated contact 1206 can function to serve as an external connection to other systems for the integrated circuit die 1214. For example, the isolated contact 1206 can connect to a substrate 1204 or to a next level system (not shown). The isolated contact 1206 can be exposed from an encapsulation 1202, with only the internal connection pad 1222 embedded in the encapsulation 1202.

The contact body 1218 is defined as the base structure of the isolated contact 1206 from which the contact protrusion 1208 extends, and the structure on which the contact pad 1220 and the internal connection pad 1222 can be formed. The contact body 1218 can be made from many different materials such as copper, tin, zinc, or other conductive metal or alloys. For example, the contact body 1218 can have a distinctive shape which includes the contact protrusion 1208 and a side protrusion 1224.

The side protrusion 1224 is defined as an extension coming out of the non-horizontal side of the isolated contact 1206 or the die paddle 1210. For example, the side protrusion 1224 can be formed on the sides of the contact body 1218 and can have different shapes. For example, if the side protrusions 1224 are formed as part of an etching process, the side protrusions 1224 can take the shape of a concave surface converging or merging to a point with a flat surface.

The contact protrusion 1208 is defined as a portion of the contact body 1218 extending from the bottom of the isolated contact 1206. The structure of the contact protrusion 1208 includes an upper protrusion surface 1226, a lower protrusion surface 1228, a protrusion sidewall 1230, and a protrusion recess 1232. The contact protrusion 1208 can be formed in a number of ways. For example, the contact protrusion 1208 can be formed by stamping, cutting, drilling, etching, or other process for physically shaping metal.

The upper protrusion surface 1226 is defined as the portion of the contact protrusion 1208 on the outer perimeter of the contact protrusion 1208. For example, the upper protrusion surface 1226 can extend from the vertical edge of the bottom of the isolated contact 1206 to the protrusion sidewall 1230. The upper protrusion surface 1226 can be horizontally planar.

The protrusion sidewall 1230 is defined as the side of the contact protrusion 1208 that extends in a non-horizontal direction from the bottom of the isolated contact 1206. For example, the protrusion sidewall 1230 can extend from the inner edge of the upper protrusion surface 1226 to the outer edge of the lower protrusion surface 1228. The protrusion sidewall 1230 can be curved or planar and at an angle to the upper protrusion surface 1226 and the lower protrusion surface 1228.

The lower protrusion surface 1228 is defined as the bottom of the contact protrusion 1208 inside the area defined by the protrusion sidewall 1230. For example, the lower protrusion surface 1228 can be at an angle to the protrusion sidewall 1230 and can include the protrusion recess 1232. The lower protrusion surface 1228 can also be parallel with the upper protrusion surface 1226, for example. The lower protrusion surface 1228, the upper protrusion surface 1226, the protrusion sidewall 1230, and the protrusion recess 1232 can be covered by the contact pad 1220.

The protrusion recess 1232 is defined as an indentation in the lower protrusion surface 1228. For example, the protrusion recess 1232 can be an indentation in the center of the lower protrusion surface 1228, a groove across the center of the lower protrusion surface 1228, or an indentation along the edge of the lower protrusion surface 1228. The protrusion recess 1232 at the edge of the lower protrusion surface 1228 can also be an indentation in a portion of the protrusion sidewall 1230.

It has been discovered that the contact protrusion 1208 having a shape defined by the upper protrusion surface 1226, the lower protrusion surface 1228, the protrusion sidewall 1230, and the protrusion recess 1232 increases reliability of the connection between the isolated contact 1206 and another system due to stronger resistance to multidirectional and shear forces in the solder used to connect the isolated contact 1206 and another system. For example, because the solder will surround the contact protrusion 1208, the resistance to shear forces is not determined merely by the contact adhesion but is also determined by the physical locking of the contact protrusion 1208 in the solder. The lower protrusion surface 1228 and the protrusion sidewall 1230 extending into the solder and the solder extending into the protrusion recess 1232 can help prevent the solder from breaking or delaminating due to shear forces that can be caused by a difference in the thermal expansion of the substrate 1204 and a package defined by the shape of the encapsulation 1202.

It has also been discovered that the increased surface area provided by the nonplanar shape of the contact protrusion 1208 also can provide a stronger contact between the isolated contact 1206 and the solder. For example, the upper protrusion surface 1226, the lower protrusion surface 1228, the protrusion sidewall 1230, and the protrusion recess 1232 all combine to allow for greater surface area within the same amount of horizontal space due to increased surface area in a non-horizontal direction. This can allow for greater contact between the solder and the contact protrusion 1208, and therefore a stronger connection. As another example, the increased contact surface of the contact protrusion 1208 can allow the formation of smaller instances of the isolated contact 1206, allowing for the same reliability as a larger instance of the isolated contact 1206 without the contact protrusion 1208, thereby allowing more contacts to be formed in the same size package.

The contact pad 1220 is defined as a conductive material on the contact protrusion 1208. The contact pad 1220 can be a thin layer of conductive metal. The contact pad 1220 can cover the upper protrusion surface 1226, the lower protrusion surface 1228, the protrusion sidewall 1230, and the protrusion recess 1232.

The contact pad 1220 can be formed in a number of ways. For example, the contact pad 1220 can be formed by a process such as sputtering, electroplating, or chemical vapor deposition (CVD). The contact pad 1220 can be made from a metal such as gold, silver, nickel, an alloy thereof, other conductive metal, or a solder-wettable material.

The internal connection pad 1222 is defined as a conductive material on the top of the isolated contact 1206. The internal connection pad 1222 can be a thin layer of conductive metal. The internal connection pad 1222 can be formed in a number of ways. For example, the internal connection pad 1222 can be formed by a process such as sputtering, electroplating, or chemical vapor deposition (CVD). The internal connection pad 1222 can be made from a metal such as gold, silver, nickel, an alloy thereof, or other conductive material.

The die paddle 1210 is defined as a supportive structure proximate to interface contacts and made from the same material as the interface contacts. For example, the die paddle 1210 can include a top surface 1234 having a paddle recess 12260, a die attach pad 1236, the die paddle contour 1212, and a die paddle pad 1238. The die paddle 1210 can be made from different materials such as copper, tin, zinc, other conductive metal, or alloys thereof. For example, the die paddle 1210 can have a distinctive shape which includes the die paddle contour 1212 and the side protrusion 1224.

The side protrusion 1224 can be formed on the sides of the die paddle 1210 and can have different shapes. For example, if the side protrusions 1224 are formed as part of an etching process, they can take the shape of a concave surface converging or merging to a point with a flat surface.

The die attach pad 1236 can be on the top surface 1234 of the die paddle 1210. The top surface 1234 can have the paddle recess 1260, which is an indentation in the top surface 1234 of the die paddle 1210. The die attach pad 1236 can be located only on the edges of the top surface 1234, and only on areas not inside the paddle recess 1260.

The die attach pad 1236 is defined as the location through which the integrated circuit die 1214 is connected to ground. The die attach pad 1236 can be a thin layer of conductive metal. The die attach pad 1236 can partially cover the top surface 1234 of the die attach pad 1236. There can be many instances of the die attach pad 1236, which can be arranged in an array on the top surface 1234 but not within the paddle recess 1260.

The die paddle contour 1212 is defined as a portion of the die paddle 1210 at the bottom of the die paddle 1210 having a nonplanar shape. The structure of the die paddle contour 1212 can include an upper paddle protrusion surface 1240, a lower paddle protrusion surface 1242, and a paddle protrusion sidewall 1244. The die paddle contour 1212 can be formed in a number of ways. For example, the die paddle contour 1212 can be formed by stamping, cutting, drilling, etching, or other process for physically shaping metal.

The upper paddle protrusion surface 1240 is defined as the portion of the die paddle contour 1212 on the outer perimeter of the die paddle contour 1212. For example, the upper paddle protrusion surface 1240 can extend from the vertical edge of the bottom of the die paddle 1210 to the paddle protrusion sidewall 1244. The upper paddle protrusion surface 1240 can be horizontally planar.

The paddle protrusion sidewall 1244 is defined as the side of the die paddle contour 1212 that extends vertically from the bottom of the isolated contact 1206 or the die paddle contour 1212. For example, the paddle protrusion sidewall 1244 can extend from the inner edge of the upper paddle protrusion surface 1240 to the outer edge of the lower paddle protrusion surface 1242. The paddle protrusion sidewall 1244 can be vertically planar and can be perpendicular to the upper paddle protrusion surface 1240 and the lower paddle protrusion surface 1242.

The lower paddle protrusion surface 1242 is defined as the bottom of the die paddle contour 1212 inside the area defined by the paddle protrusion sidewall 1244. For example, the lower paddle protrusion surface 1242 can be perpendicular to the paddle protrusion sidewall 1244 and can be horizontally planar. The lower paddle protrusion surface 1242 can also be parallel with the upper paddle protrusion surface 1240, for example. The lower paddle protrusion surface 1242, the upper paddle protrusion surface 1240, and the paddle protrusion sidewall 1244 can be covered by the die paddle pad 1238.

It has been discovered that the die paddle contour 1212 having a shape defined by the upper paddle protrusion surface 1240, the lower paddle protrusion surface 1242, and the paddle protrusion sidewall 1244 increases reliability of the connection between the die paddle 1210 and another system due to stronger resistance to multidirectional and shear forces in the solder used to connect the die paddle 1210 and another system. For example, because the solder will surround the die paddle contour 1212, the resistance to shear forces is not determined merely by the contact adhesion but is also determined by the physical locking of the die paddle contour 1212 in the solder. The lower paddle protrusion surface 1242 and the paddle protrusion sidewall 1244 extending into the solder can help prevent the solder from breaking or delaminating due to shear forces that can be caused by a difference in the thermal expansion of the substrate 1204 and a package defined by the shape of the encapsulation 1202.

The die paddle pad 1238 is defined as a conductive metal on the die paddle contour 1212. The die paddle pad 1238 can be a thin layer of conductive metal. The die paddle pad 1238 covers only the upper paddle protrusion surface 1240, the lower paddle protrusion surface 1242, and the paddle protrusion sidewall 1244.

The die paddle pad 1238 can be formed in a number of ways. For example, the die paddle pad 1238 can be formed by a process such as sputtering, electroplating, or chemical vapor deposition (CVD). The die paddle pad 1238 can be made from a metal such as gold, silver, nickel, an alloy thereof, other conductive metal, or a solder-wettable material.

The integrated circuit die 1214 is defined as a chip containing active circuitry. The integrated circuit die 1214 can be attached to the top surface 1234 of the die paddle 1210 within the paddle recess 1260 with a die attach adhesive 1246. The integrated circuit die 1214 can be located in the middle of an array of the die attach pad 1236. The integrated circuit die 1214 in the paddle recess 1260 can allow the formation of a lower profile package while maintaining the same thermal and electrical characteristics.

The die attach adhesive 1246 is defined as a substance used to bond two or more solid elements together. The die attach adhesive 1246 can be a resin, glue, paste, cement, putty, or a polyvinyl resin emulsion. The die attach adhesive 1246 can be on and between the die paddle 1210 and the integrated circuit die 1214 and can partially cover the sides of the integrated circuit die 1214.

The integrated circuit die 1214 can be attached to the die paddle 1210 with the passive side facing down and the active side facing up. The integrated circuit die 1214 can be connected to the isolated contact 1206 with bond wires 1248. The integrated circuit die 1214 can be connected to the die attach pad 1236 with the bond wires 1248. The die attach pad 1236 can be part of a path to ground and a thermal path for the integrated circuit die 1214.

The organic filler 1216 is defined as a curable adhesive which also provides structural support once cured. For example, the organic filler 1216 can be a curable underfill or curable epoxy which is liquid at room temperature. For example, the organic filler 1216 can be a liquid curable by heat or electromagnetic radiation such as ultraviolet (UV) light.

The organic filler 1216 can fully cover the sides of the isolated contact 1206 and the die paddle 1210, and be in direct contact with the encapsulation 1202. For example, the organic filler 1216 can be between and in contact with the die paddle 1210 and the isolated contact 1206, and level with the upper protrusion surface 1226 of the isolated contact 1206. The isolated contact 1206 can be embedded in the organic filler 1216 with the contact protrusion 1208 exposed from the organic filler 1216. The organic filler 1216 can adhere to the encapsulation 1202.

The contact protrusion 1208 can extend past the external surface of the organic filler 1216 and the contact pad 1220 can be exposed from the organic filler 1216. The organic filler 1216 is shown as covering a small portion of the contact pad 1220, but it is understood that this is for illustrative purposes and that the contact pad 1220 can also be fully exposed from the organic filler 1216. A standoff height 1250 is defined as the distance between the external surface of the organic filler 1216 and the contact pad 1220 on the lower protrusion surface 1228 of the isolated contact 1206. Carefully controlling the application of the organic filler 1216 can set the level of the external surface of the organic filler 1216 at a level that creates the standoff height 1250 exposing the contact protrusion 1208. For example, the standoff height 1250 can be 20% to 50% of the height of the isolated contact 1206.

It has been discovered that the organic filler 1216 covering the sides of the isolated contact 1206 while leaving the standoff height 1250 exposing the contact protrusion 1208 can improve the reliability of the integrated circuit package 1252 due to a terminal locking effect of the isolated contact 1206 in the organic filler 1216 while also providing a strong connection to the contact protrusion 1208. For example, because the side protrusions 1224 of the isolated contact 1206 are fully embedded in the organic filler 1216, which is also adhered to the encapsulation 1202, the isolated contact 1206 can be resistant to lead pull out which can lead to subsequent board-level failure. The contact protrusion 1208 exposed from the organic filler 1216 can allow a strong connection to a next level system (not shown) while also having a strong resistance to lead pull out.

The organic filler 1216 separates a plurality of the isolated contact 1206 and with the encapsulation 1202 maintains the structure of the integrated circuit package 1252. The encapsulation 1202 can have a planar surface on the top and sides of the encapsulation 1202. The encapsulation 1202 can be in direct contact with the organic filler 1216 on the bottom surface of the encapsulation between the die paddle 1210 and the isolated contact 1206. The organic filler 1216 can leave exposed the bottom of the isolated contact 1206 and the die paddle 1210.

Figure 13:
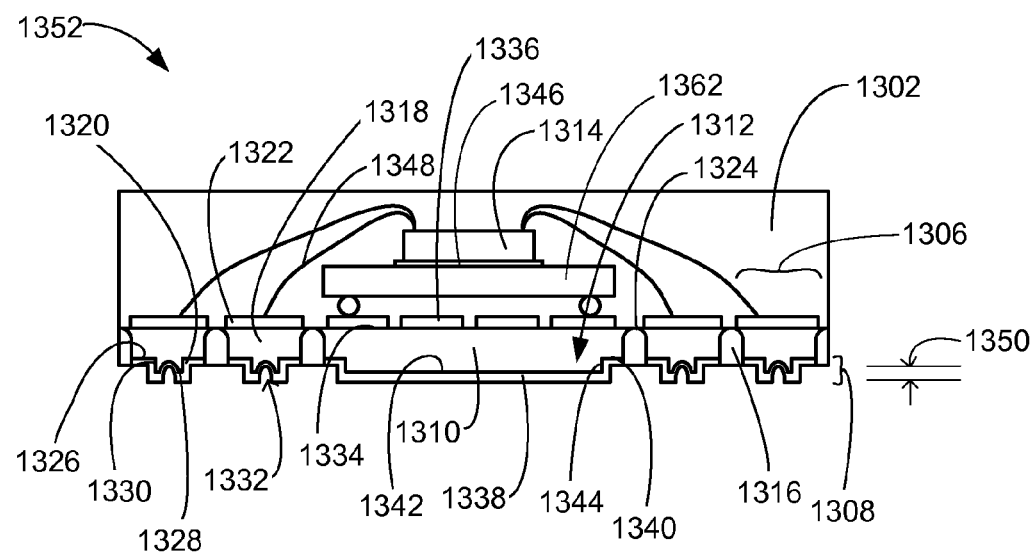
FIG. 13 is a cross-sectional view of the integrated circuit package without the substrate as exemplified by the top view of FIG. 1 and along the section line 2-2 of FIG. 1 in a fourth embodiment of the present invention.

Referring now to FIG. 13, therein is shown a cross-sectional view of the integrated circuit package 1352 without the substrate 104 of FIG. 1 as exemplified by the top view of FIG. 1 and along the section line 2-2 of FIG. 1 in a fourth embodiment of the present invention. The integrated circuit package 1352 is shown having an isolated contact 1306 having a contact protrusion 1308, a die paddle 1310 having a die paddle contour 1312, an integrated circuit die 1314, and an organic filler 1316, as an example.

The isolated contact 1306 is defined as a standalone interconnect structure with an extended feature on the bottom. The isolated contact 1306 includes a contact body 1318, the contact protrusion 1308, a contact pad 1320, and an internal connection pad 1322. The isolated contact 1306 can function to serve as an external connection to other systems for the integrated circuit die 1314. For example, the isolated contact 1306 can connect to a substrate 1304 or to a next level system (not shown). The isolated contact 1306 can be exposed from an encapsulation 1302, with only the internal connection pad 1322 embedded in the encapsulation 1302.

The contact body 1318 is defined as the base structure of the isolated contact 1306 from which the contact protrusion 1308 extends, and the structure on which the contact pad 1320 and the internal connection pad 1322 can be formed. The contact body 1318 can be made from many different materials such as copper, tin, zinc, or other conductive metal or alloys. For example, the contact body 1318 can have a distinctive shape which includes the contact protrusion 1308 and a side protrusion 1324.

The side protrusion 1324 is defined as an extension coming out of the non-horizontal side of the isolated contact 1306 or the die paddle 1310. For example, the side protrusion 1324 can be formed on the sides of the contact body 1318 and can have different shapes. For example, if the side protrusions 1324 are formed as part of an etching process, the side protrusions 1324 can take the shape of a concave surface converging or merging to a point with a flat surface.

The contact protrusion 1308 is defined as a portion of the contact body 1318 extending from the bottom of the isolated contact 1306. The structure of the contact protrusion 1308 includes an upper protrusion surface 1326, a lower protrusion surface 1328, a protrusion sidewall 1330, and a protrusion recess 1332. The contact protrusion 1308 can be formed in a number of ways. For example, the contact protrusion 1308 can be formed by stamping, cutting, drilling, etching, or other process for physically shaping metal.

The upper protrusion surface 1326 is defined as the portion of the contact protrusion 1308 on the outer perimeter of the contact protrusion 1308. For example, the upper protrusion surface 1326 can extend from the vertical edge of the bottom of the isolated contact 1306 to the protrusion sidewall 1330. The upper protrusion surface 1326 can be horizontally planar.

The protrusion sidewall 1330 is defined as the side of the contact protrusion 1308 that extends in a non-horizontal direction from the bottom of the isolated contact 1306. For example, the protrusion sidewall 1330 can extend from the inner edge of the upper protrusion surface 1326 to the outer edge of the lower protrusion surface 1328. The protrusion sidewall 1330 can be curved or planar and at an angle to the upper protrusion surface 1326 and the lower protrusion surface 1328.

The lower protrusion surface 1328 is defined as the bottom of the contact protrusion 1308 inside the area defined by the protrusion sidewall 1330. For example, the lower protrusion surface 1328 can be at an angle to the protrusion sidewall 1330 and can include the protrusion recess 1332. The lower protrusion surface 1328 can also be parallel with the upper protrusion surface 1326, for example. The lower protrusion surface 1328, the upper protrusion surface 1326, the protrusion sidewall 1330, and the protrusion recess 1332 can be covered by the contact pad 1320.

The protrusion recess 1332 is defined as an indentation in the lower protrusion surface 1328. For example, the protrusion recess 1332 can be an indentation in the center of the lower protrusion surface 1328, a groove across the center of the lower protrusion surface 1328, or an indentation along the edge of the lower protrusion surface 1328. The protrusion recess 1332 at the edge of the lower protrusion surface 1328 can also be an indentation in a portion of the protrusion sidewall 1330.

It has been discovered that the contact protrusion 1308 having a shape defined by the upper protrusion surface 1326, the lower protrusion surface 1328, the protrusion sidewall 1330, and the protrusion recess 1332 increases reliability of the connection between the isolated contact 1306 and another system due to stronger resistance to multidirectional and shear forces in the solder used to connect the isolated contact 1306 and another system. For example, because the solder will surround the contact protrusion 1308, the resistance to shear forces is not determined merely by the contact adhesion but is also determined by the physical locking of the contact protrusion 1308 in the solder. The lower protrusion surface 1328 and the protrusion sidewall 1330 extending into the solder and the solder extending into the protrusion recess 1332 can help prevent the solder from breaking or delaminating due to shear forces that can be caused by a difference in the thermal expansion of the substrate 1304 and a package defined by the shape of the encapsulation 1302.

It has also been discovered that the increased surface area provided by the nonplanar shape of the contact protrusion 1308 also can provide a stronger contact between the isolated contact 1306 and the solder. For example, the upper protrusion surface 1326, the lower protrusion surface 1328, the protrusion sidewall 1330, and the protrusion recess 1332 all combine to allow for greater surface area within the same amount of horizontal space due to increased surface area in a non-horizontal direction. This can allow for greater contact between the solder and the contact protrusion 1308, and therefore a stronger connection. As another example, the increased contact surface of the contact protrusion 1308 can allow the formation of smaller instances of the isolated contact 1306, allowing for the same reliability as a larger instance of the isolated contact 1306 without the contact protrusion 1308, thereby allowing more contacts to be formed in the same size package.

The contact pad 1320 is defined as a conductive material on the contact protrusion 1308. The contact pad 1320 can be a thin layer of conductive metal. The contact pad 1320 can cover the upper protrusion surface 1326, the lower protrusion surface 1328, the protrusion sidewall 1330, and the protrusion recess 1332.

The contact pad 1320 can be formed in a number of ways. For example, the contact pad 1320 can be formed by a process such as sputtering, electroplating, or chemical vapor deposition (CVD). The contact pad 1320 can be made from a metal such as gold, silver, nickel, an alloy thereof, other conductive metal, or a solder-wettable material.

The internal connection pad 1322 is defined as a conductive material on the top of the isolated contact 1306. The internal connection pad 1322 can be a thin layer of conductive metal. The internal connection pad 1322 can be formed in a number of ways. For example, the internal connection pad 1322 can be formed by a process such as sputtering, electroplating, or chemical vapor deposition (CVD). The internal connection pad 1322 can be made from a metal such as gold, silver, nickel, an alloy thereof, or other conductive material.

The die paddle 1310 is defined as a supportive structure proximate to interface contacts and made from the same material as the interface contacts. For example, the die paddle 1310 can include a top surface 1334, a die attach pad 1336, the die paddle contour 1312, and a die paddle pad 1338. The die paddle 1310 can be made from different materials such as copper, tin, zinc, other conductive metal, or alloys thereof. For example, the die paddle 1310 can have a distinctive shape which includes the die paddle contour 1312 and the side protrusion 1324.

The side protrusion 1324 can be formed on the sides of the die paddle 1310 and can have different shapes. For example, if the side protrusions 1324 are formed as part of an etching process, they can take the shape of a concave surface converging or merging to a point with a flat surface.

The die attach pad 1336 can be on the top surface 1334 of the die paddle 1310. The die attach pad 1336 is defined as the location through which the integrated circuit die 1314 is connected to ground. The die attach pad 1336 can be a thin layer of conductive metal. The die attach pad 1336 can partially cover the top surface 1334 of the die attach pad 1336. There can be many instances of the die attach pad 1336, which can be arranged in an array on the top surface 1334.

The die paddle contour 1312 is defined as a portion of the die paddle 1310 at the bottom of the die paddle 1310 having a nonplanar shape. The structure of the die paddle contour 1312 can include an upper paddle protrusion surface 1340, a lower paddle protrusion surface 1342, and a paddle protrusion sidewall 1344. The die paddle contour 1312 can be formed in a number of ways. For example, the die paddle contour 1312 can be formed by stamping, cutting, drilling, etching, or other process for physically shaping metal.

The upper paddle protrusion surface 1340 is defined as the portion of the die paddle contour 1312 on the outer perimeter of the die paddle contour 1312. For example, the upper paddle protrusion surface 1340 can extend from the vertical edge of the bottom of the die paddle 1310 to the paddle protrusion sidewall 1344. The upper paddle protrusion surface 1340 can be horizontally planar.

The paddle protrusion sidewall 1344 is defined as the side of the die paddle contour 1312 that extends vertically from the bottom of the isolated contact 1306 or the die paddle contour

1312. For example, the paddle protrusion sidewall 1344 can extend from the inner edge of the upper paddle protrusion surface 1340 to the outer edge of the lower paddle protrusion surface 1342. The paddle protrusion sidewall 1344 can be vertically planar and can be perpendicular to the upper paddle protrusion surface 1340 and the lower paddle protrusion surface 1342.

The lower paddle protrusion surface 1342 is defined as the bottom of the die paddle contour 1312 inside the area defined by the paddle protrusion sidewall 1344. For example, the lower paddle protrusion surface 1342 can be perpendicular to the paddle protrusion sidewall 1344 and can be horizontally planar. The lower paddle protrusion surface 1342 can also be parallel with the upper paddle protrusion surface 1340, for example. The lower paddle protrusion surface 1342, the upper paddle protrusion surface 1340, and the paddle protrusion sidewall 1344 can be covered by the die paddle pad 1338.

It has been discovered that the die paddle contour 1312 having a shape defined by the upper paddle protrusion surface 1340, the lower paddle protrusion surface 1342, and the paddle protrusion sidewall 1344 increases reliability of the connection between the die paddle 1310 and another system due to stronger resistance to multidirectional and shear forces in the solder used to connect the die paddle 1310 and another system. For example, because the solder will surround the die paddle contour 1312, the resistance to shear forces is not determined merely by the contact adhesion but is also determined by the physical locking of the die paddle contour 1312 in the solder. The lower paddle protrusion surface 1342 and the paddle protrusion sidewall 1344 extending into the solder can help prevent the solder from breaking or delaminating due to shear forces that can be caused by a difference in the thermal expansion of the substrate 1304 and a package defined by the shape of the encapsulation 1302.

The die paddle pad 1338 is defined as a conductive metal on the die paddle contour 1312. The die paddle pad 1338 can be a thin layer of conductive metal. The die paddle pad 1338 covers only the upper paddle protrusion surface 1340, the lower paddle protrusion surface 1342, and the paddle protrusion sidewall 1344.

The die paddle pad 1338 can be formed in a number of ways. For example, the die paddle pad 1338 can be formed by a process such as sputtering, electroplating, or chemical vapor deposition (CVD). The die paddle pad 1338 can be made from a metal such as gold, silver, nickel, an alloy thereof, other conductive metal, or a solder-wettable material.

The integrated circuit die 1314 is defined as a chip containing active circuitry. The integrated circuit die 1314 can be attached to the top of a flip chip 1362 with a die attach adhesive 1346. The flip chip 1362 can be mounted on the top surface 1334 of the die paddle 1310 and the die attach pad 1336. The die attach pad 1336 can be part of a redistribution layer.

The integrated circuit die 1314 is positioned above the die attach pad 1336. The die attach adhesive 1346 is defined as a substance used to bond two or more solid elements together. The die attach adhesive 1346 can be a resin, glue, paste, cement, putty, or a polyvinyl resin emulsion. The die attach adhesive 1346 can partially cover the passive side of the flip chip 1362 and fully cover the passive side of the integrated circuit die 1314.

The integrated circuit die 1314 can be attached to the flip chip 1362 with the passive side facing down and the active side facing up. The integrated circuit die 1314 can be connected to the isolated contact 1306 with bond wires 1348. The die attach pad 1336 can be part of a path to ground and a thermal path for the flip chip 1362.

The organic filler 1316 is defined as a curable adhesive which also provides structural support once cured. For example, the organic filler 1316 can be a curable underfill or curable epoxy which is liquid at room temperature. For example, the organic filler 1316 can be a liquid curable by heat or electromagnetic radiation such as ultraviolet (UV) light.

The organic filler 1316 can fully cover the sides of the isolated contact 1306 and the die paddle 1310, and be in direct contact with the encapsulation 1302. For example, the organic filler 1316 can be between and in contact with the die paddle 1310 and the isolated contact 1306, and level with the upper protrusion surface 1326 of the isolated contact 1306. The isolated contact 1306 can be embedded in the organic filler 1316 with the contact protrusion 1308 exposed from the organic filler 1316. The organic filler 1316 can adhere to the encapsulation 1302.

The contact protrusion 1308 can extend past the external surface of the organic filler 1316 and the contact pad 1320 can be exposed from the organic filler 1316. The organic filler 1316 is shown as covering a small portion of the contact pad 1320, but it is understood that this is for illustrative purposes and that the contact pad 1320 can also be fully exposed from the organic filler 1316. A standoff height 1350 is defined as the distance between the external surface of the organic filler 1316 and the contact pad 1320 on the lower protrusion surface 1328 of the isolated contact 1306. Carefully controlling the application of the organic filler 1316 can set the level of the external surface of the organic filler 1316 at a level that creates the standoff height 1350 exposing the contact protrusion 1308. For example, the standoff height 1350 can be 20% to 50% of the height of the isolated contact 1306.

It has been discovered that the organic filler 1316 covering the sides of the isolated contact 1306 while leaving the standoff height 1350 exposing the contact protrusion 1308 can improve the reliability of the integrated circuit package 1352 due to a terminal locking effect of the isolated contact 1306 in the organic filler 1316 while also providing a strong connection to the contact protrusion 1308. For example, because the side protrusions 1324 of the isolated contact 1306 are fully embedded in the organic filler 1316, which is also adhered to the encapsulation 1302, the isolated contact 1306 can be resistant to lead pull out which can lead to subsequent board-level failure. The contact protrusion 1308 exposed from the organic filler 1316 can allow a strong connection to a next level system (not shown) while also having a strong resistance to lead pull out.

The organic filler 1316 separates a plurality of the isolated contact 1306 and with the encapsulation 1302 maintains the structure of the integrated circuit package 1352. The encapsulation 1302 can have a planar surface on the top and sides of the encapsulation 1302. The encapsulation 1302 can be in direct contact with the organic filler 1316 on the bottom surface of the encapsulation between the die paddle 1310 and the isolated contact 1306. The organic filler 1316 can leave exposed the bottom of the isolated contact 1306 and the die paddle 1310.

Figure 14:
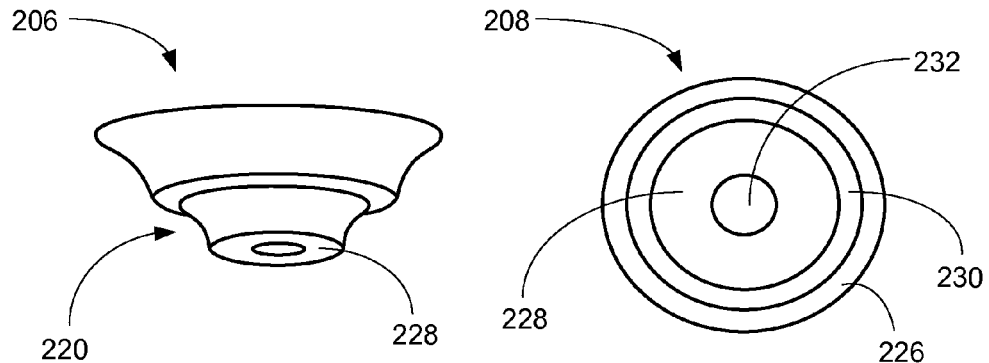
FIG. 14 is an exemplary composite view of a portion of the isolated contact as exemplified by the partial cross-sectional view of FIG. 3.

Referring now to FIG. 14, therein is shown an exemplary composite view of a portion of the isolated contact 206 as exemplified by the partial cross-sectional view of FIG. 3. The orthogonal view of the portion of the isolated contact 206 shows the contact protrusion 208 extending from the bottom of the isolated contact 206, with the protrusion recess 232 located in the middle of the lower protrusion surface 228. In this example, the protrusion sidewall 230 can have a curved shape that connects the lower protrusion surface 228 and the upper protrusion surface 226. The protrusion sidewall 230 can also have a planar surface. The contact protrusion 208 can be covered by the contact pad 220.

The bottom view of the contact protrusion 208 shows the protrusion recess 232 in the center of the lower protrusion surface 228. The protrusion sidewall 230 is shown at an angle to both the lower protrusion surface 228 and the upper protrusion surface 226, though it is understood that the protrusion sidewall 230 could be perpendicular to the lower protrusion surface 228 and the upper protrusion surface 226, for example. The protrusion recess 232 can add extra surface area for solder to bond to as compared to the contact protrusion 208 without the protrusion recess 232, thereby creating a stronger connection without increasing the size of the connector.

Figure 15:
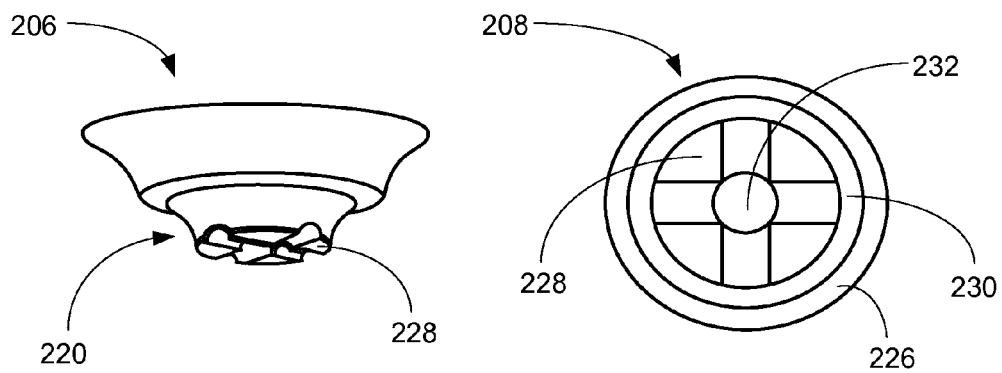
FIG. 15 is another exemplary composite view of a portion of the isolated contact as exemplified by the partial cross-sectional view of FIG. 3.

Referring now to FIG. 15, therein is shown another exemplary composite view of a portion of the isolated contact 206 as exemplified by the partial cross-sectional view of FIG. 3. The orthogonal view of the portion of the isolated contact 206 shows the contact protrusion 208 extending from the bottom of the isolated contact 206, with the protrusion recess 232 located in the middle of the lower protrusion surface 228. The contact protrusion 208 is also shown having grooves in the lower protrusion surface 228. The groves can extend to the edge of the lower protrusion surface 228. In this example, the protrusion sidewall 230 can have a curved shape that connects the lower protrusion surface 228 and the upper protrusion surface 226. The protrusion sidewall 230 can also have a planar surface. The contact protrusion 208 can be covered by the contact pad 220.

The bottom view of the contact protrusion 208 shows the protrusion recess 232 in the center of the lower protrusion surface 228 and grooves in the lower protrusion surface 228 in a cross-shaped pattern. The protrusion sidewall 230 is shown at an angle to both the lower protrusion surface 228 and the upper protrusion surface 226, though it is understood that the protrusion sidewall 230 could be perpendicular to the lower protrusion surface 228 and the upper protrusion surface 226, for example. The cross-shaped grooves in the lower protrusion surface 228 can help create a greater amount of surface area for connection within the same amount of space thereby creating a stronger connection without increasing the size of the connector.

Figure 16:
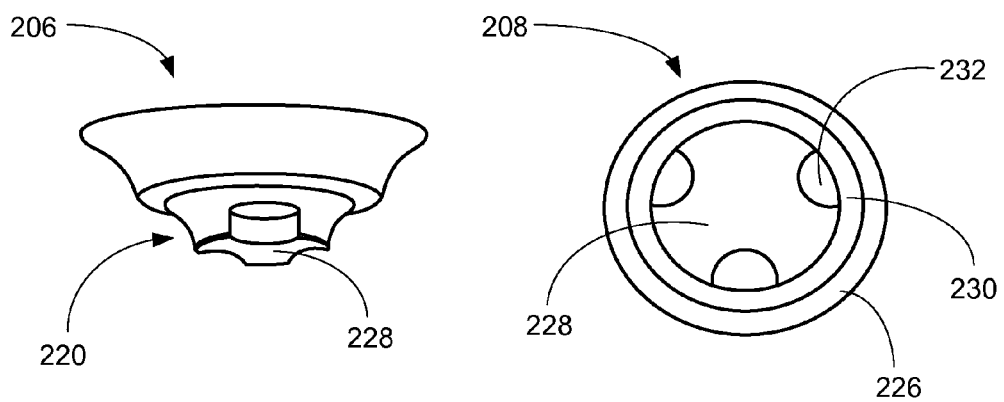
FIG. 16 is another exemplary composite view of a portion of the isolated contact as exemplified by the partial cross-sectional view of FIG. 3.

Referring now to FIG. 16, therein is shown another exemplary composite view of a portion of the isolated contact 206 as exemplified by the partial cross-sectional view of FIG. 3. The orthogonal view of the portion of the isolated contact 206 shows the contact protrusion 208 extending from the bottom of the isolated contact 206, with more than one instance of the protrusion recess 232 on the edge of the lower protrusion surface 228. In this example, the protrusion sidewall 230 can have a curved shape that connects the lower protrusion surface 228 and the upper protrusion surface 226. The protrusion sidewall 230 can also have a planar surface. The contact protrusion 208 can be covered by the contact pad 220.

The bottom view of the contact protrusion 208 shows the protrusion recesses 232 on the edge of the lower protrusion surface 228 arranged with trilateral symmetry. Because the protrusion recesses 232 are on the edge of the lower protrusion surface 228, the protrusion recesses 232 can also be in the protrusion sidewall 230. The protrusion sidewall 230 is shown at an angle to both the lower protrusion surface 228 and the upper protrusion surface 226, though it is understood that the protrusion sidewall 230 could be perpendicular to the lower protrusion surface 228 and the upper protrusion surface 226, for example. The protrusion recesses 232 arranged in a trilaterally symmetrical formation in the lower protrusion surface 228 can help create a greater amount of surface area for connection within the same amount of space, thereby creating a stronger connection without increasing the size of the connector.

Figure 17:
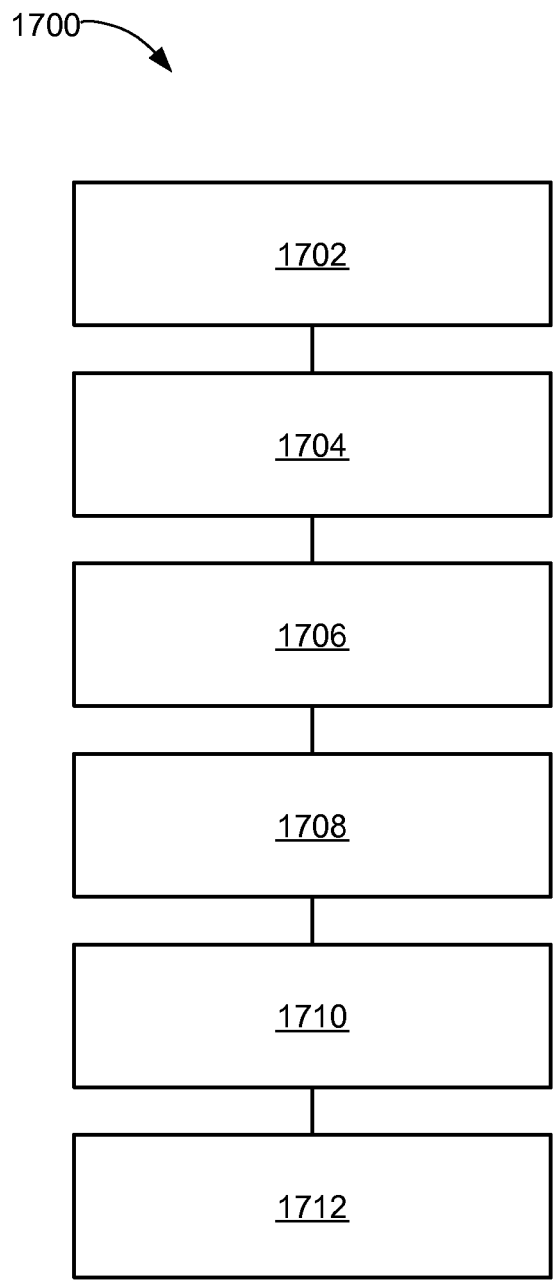
FIG. 17 is a flow chart of a method of manufacture of the integrated circuit packaging system in a further embodiment of the present invention.

Referring now to FIG. 17, therein is shown a flow chart of a method 1700 of manufacture of an integrated circuit packaging system in a further embodiment of the present invention. The method 1700 includes: forming an isolated contact having a contact protrusion in a block 1702; forming a die paddle, adjacent to the isolated contact, having a die paddle contour in a block 1704; depositing a contact pad on the contact protrusion in a block 1706; coupling an integrated circuit die to the contact protrusion in a block 1708; molding an encapsulation on the integrated circuit die in a block 1710; and depositing an organic filler on and between the isolated contact and the die paddle, the contact protrusion extended past the organic filler in a block 1712.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
    an isolated contact having a contact protrusion;
    a die paddle, adjacent to the isolated contact, having a die paddle contour;
    a contact pad on the contact protrusion;
    an integrated circuit die coupled to the contact protrusion;
    an encapsulation on the integrated circuit die; and
    an organic filler on and between the isolated contact and the die paddle, the contact protrusion extended past the organic filler.

2. The integrated circuit packaging system according to claim 1 wherein the isolated contact includes a lower protrusion surface, an upper protrusion surface, a protrusion sidewall, and a protrusion recess in the lower protrusion surface.

3. The integrated circuit packaging system according to claim 1 further comprising:
    a substrate; and
    a conductive material on the contact pad, the conductive material connecting the isolated contact and the substrate, the conductive material covering the lower protrusion surface, the upper protrusion surface, and the protrusion sidewall.

4. The integrated circuit packaging system according to claim 1 wherein the die paddle contour includes a lower paddle protrusion surface, an upper paddle protrusion surface, and a paddle protrusion sidewall.

5. The integrated circuit packaging system according to claim 1 further comprising:
   an internal connection pad on the isolated contact over the contact protrusion; and
   a bond wire connecting the integrated circuit die and the internal connection pad.

6. The integrated circuit packaging system according to 1 further comprising:
   an internal connection pad on the isolated contact over the contact protrusion; and
   a bond wire connecting the integrated circuit die and the internal connection pad;
   wherein:
   the isolated contact includes a lower protrusion surface, an upper protrusion surface, a protrusion sidewall, and a protrusion recess in the lower protrusion surface.

7. The integrated circuit packaging system according to claim 6 further comprising:
   a flip chip coupled to the die paddle; and
   a die attach adhesive on the flip chip, the integrated circuit die positioned on the die attach adhesive.

8. The integrated circuit packaging system according to claim 6 wherein the isolated contact having the protrusion recess in the lower protrusion surface includes the protrusion recess in the center of the lower protrusion surface.

9. The integrated circuit packaging system according to claim 6 wherein the isolated contact having the protrusion recess in the lower protrusion surface includes the lower protrusion surface having a cross-shaped groove.

10. The integrated circuit packaging system according to claim 6 wherein the isolated contact having the protrusion recess in the lower protrusion surface includes the protrusion recess in the protrusion sidewall.

* * * * *